United States Patent
Li et al.

(10) Patent No.: US 12,512,401 B2
(45) Date of Patent: Dec. 30, 2025

(54) INTEGRATED DEVICE SUBSTRATE INCLUDING EMBEDDED ELECTROMAGNETIC ISOLATION STRUCTURE

(71) Applicant: QUALCOMM Incorporated, San Diego, CA (US)

(72) Inventors: Yue Li, San Diego, CA (US); Durodami Lisk, San Diego, CA (US); Charles David Paynter, Encinitas, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 23 days.

(21) Appl. No.: 18/419,763

(22) Filed: Jan. 23, 2024

(65) Prior Publication Data

US 2025/0239513 A1    Jul. 24, 2025

(51) Int. Cl.
*H05K 1/02* (2006.01)
*H01L 21/48* (2006.01)
*H01L 23/498* (2006.01)
*H01L 23/552* (2006.01)
*H01L 23/00* (2006.01)

(52) U.S. Cl.
CPC .... *H01L 23/49838* (2013.01); *H01L 21/4846* (2013.01); *H01L 23/552* (2013.01); *H05K 1/0222* (2013.01); *H01L 24/16* (2013.01); *H01L 2224/16227* (2013.01)

(58) Field of Classification Search
CPC .................................................... H05K 1/0222
See application file for complete search history.

(56) References Cited

U.S. PATENT DOCUMENTS 10,373,901 B1 * 8/2019 Tsao ................. H01L 23/49894
2002/0130739 A1 * 9/2002 Cotton .................. H05K 1/115
    333/248

* cited by examiner

*Primary Examiner* — Hung V Ngo
(74) *Attorney, Agent, or Firm* — MOORE INTELLECTUAL PROPERTY LAW

(57) ABSTRACT

An integrated device includes a substrate that includes one or more conductors and a conductive wall via defining at least a portion of an electromagnetic (EM) isolation structure for the one or more conductors.

10 Claims, 13 Drawing Sheets

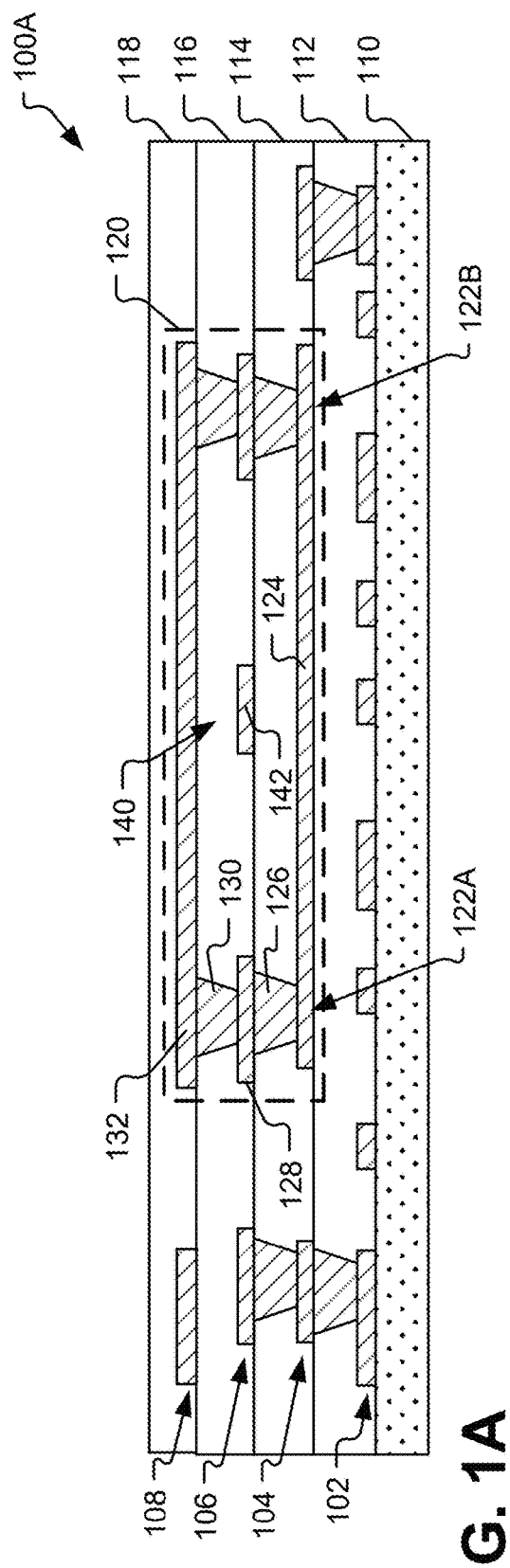
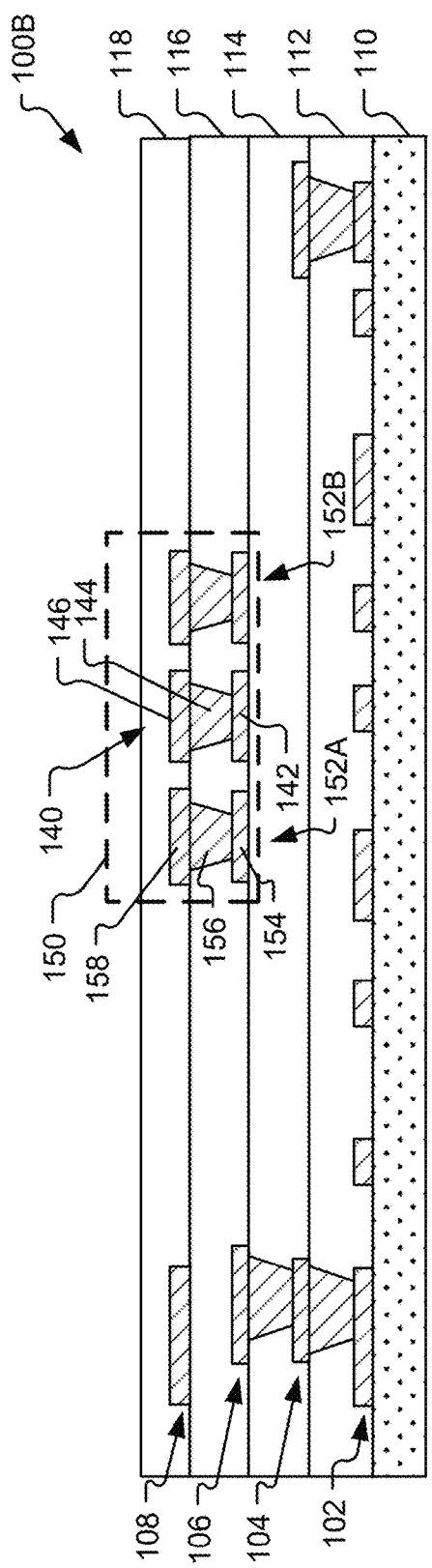
FIG. 1A
FIG. 1B

1000 ⤴

1002
FORM A CONDUCTIVE VIA THROUGH A DIELECTRIC LAYER OF A SUBSTRATE, THE CONDUCTIVE VIA ELECTRICALLY CONNECTING A FIRST CONDUCTOR OF A FIRST METAL LAYER OF THE SUBSTRATE TO A SECOND CONDUCTOR OF A SECOND METAL LAYER OF THE SUBSTRATE, WHERE THE DIELECTRIC LAYER IS DISPOSED BETWEEN THE FIRST METAL LAYER AND THE SECOND METAL LAYER

1004
FORM A CONDUCTIVE WALL VIA THROUGH THE DIELECTRIC LAYER, THE CONDUCTIVE WALL VIA AT LEAST PARTIALLY ENCIRCLING THE CONDUCTIVE VIA TO DEFINE AT LEAST A PORTION OF AN EM ISOLATION STRUCTURE FOR THE CONDUCTIVE VIA

FIG. 10

INTEGRATED DEVICE SUBSTRATE INCLUDING EMBEDDED ELECTROMAGNETIC ISOLATION STRUCTURE

FIELD

Various features relate to integrated circuit device substrates.

BACKGROUND

Electrical connections exist at each level of a system hierarchy. This system hierarchy includes interconnection of active devices at a lowest system level all the way up to system level interconnections at the highest level. For example, interconnect layers can connect different devices together on an integrated circuit. As integrated circuits become more complex, more interconnect layers are used to provide the electrical connections between the devices. More recently, the number of interconnect levels for circuitry has substantially increased due to the large number of devices that are now interconnected in a modern electronic device. The increased number of interconnect levels for supporting the increased number of devices involves more intricate processes.

State-of-the-art mobile application devices demand a small form factor, low cost, a tight power budget, and high electrical performance. Mobile package design has evolved to meet these divergent goals for enabling mobile applications that support multimedia enhancements. These mobile applications, however, are susceptible to power and signal routing issues when multiple dies are arranged within the small form factor.

High impedance in signal paths of integrated device substrates can cause a variety of challenges, such as higher losses, reduced signal integrity, increased crosstalk, reduced power distribution performance, electromagnetic emissions, and others. The impact of higher impedance is generally frequency dependent, meaning that higher frequency signal paths are particularly vulnerable to issues due to high inductance.

Many features of an integrated device substrate can contribute to increased impedance. For example, conductive vias interconnecting metal layers of the substrate introduce loop inductance, which increases the impedance of signal paths that include the conductive via and often nearby signal paths as well. As another example, closely spaced traces can affect one another due to increase impedance in their respective signal paths.

In each of the examples above, negative effects due to increased impedance can be reduced by improving electromagnetic (EM) isolation (EMI) between adjacent signal paths. However, many mechanisms for improving EMI either significantly increase cost of the substrate (e.g., by increasing manufacturing time and/or complexity), increase the size of the substrate (e.g., by increasing spacing between conductors), or both.

SUMMARY

Various features relate to integrated device substrates.

One example provides an integrated device that includes a substrate. The substrate includes one or more conductors and a conductive wall via defining at least a portion of an electromagnetic (EM) isolation structure for the one or more conductors.

Another example provides a method for fabricating an integrated device substrate. The method includes forming a patterned metal layer of a substrate. The patterned metal layer defines a conductive trace and a wall via pad adjacent to the conductive trace. The method also includes forming a conductive wall via electrically connected to the wall via pad and defining at least a portion of an EM isolation structure for the conductive trace.

Another example provides a method for fabricating an integrated device substrate. The method includes forming a conductive via through a dielectric layer of a substrate. The conductive via electrically connects a first conductor of a first metal layer of the substrate to a second conductor of a second metal layer of the substrate. The dielectric layer is disposed between the first metal layer and the second metal layer. The method also includes forming a conductive wall via through the dielectric layer. The conductive wall via at least partially encircles the conductive via to define at least a portion of an EM isolation structure for the conductive via.

BRIEF DESCRIPTION OF THE DRAWINGS

Various features, nature and advantages may become apparent from the detailed description set forth below when taken in conjunction with the drawings in which like reference characters identify correspondingly throughout.

FIG. 1A illustrates a schematic cross-sectional profile view of an example of an integrated device substrate having an embedded EM isolation structure for one or more conductors.

FIG. 1B illustrates a schematic cross-sectional profile view of another example of an integrated device substrate having an embedded EM isolation structure for one or more conductors.

FIG. 10 illustrates an exemplary flow diagram of a method for fabricating an exemplary integrated device substrate having an embedded EM isolation structure.

DETAILED DESCRIPTION

Figure 1C:
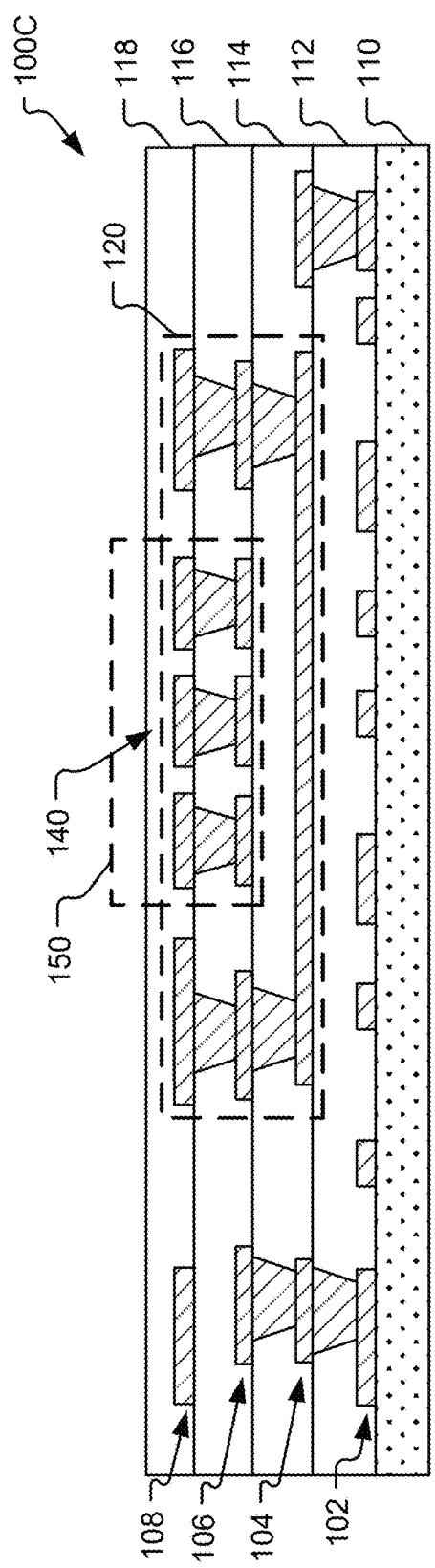
FIG. 1C illustrates a schematic cross-sectional profile view of another example of an integrated device substrate having an embedded EM isolation structure for one or more conductors.

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

Particular aspects of the present disclosure are described below with reference to the drawings. In the description, common features are designated by common reference numbers. As used herein, various terminology is used for the purpose of describing particular implementations only and is not intended to be limiting of implementations. For example, the singular forms "a," "an," and "the" are intended to include the plural forms as well, unless the context clearly indicates otherwise. Further, some features described herein are singular in some implementations and plural in other implementations. For ease of reference herein, such features are generally introduced as "one or more" features and are subsequently referred to in the singular or optional plural (as indicated by "(s)") unless aspects related to multiple of the features are being described.

In some drawings, multiple instances of a particular type of feature are used. Although these features are physically and/or logically distinct, the same reference number is used for each, and the different instances are distinguished by addition of a letter to the reference number. When the features as a group or a type are referred to herein (e.g., when no particular one of the features is being referenced), the reference number is used without a distinguishing letter. However, when one particular feature of multiple features of the same type is referred to herein, the reference number is used with the distinguishing letter. For example, referring to FIG. 1B, multiple conductive walls are illustrated and associated with reference numbers 152A and 152B. When referring to a particular one of these conductive walls, such as a conductive wall 152A, the distinguishing letter "A" is used. However, when referring to any arbitrary one of these conductive walls or to these conductive walls as a group, the reference number 152 is used without a distinguishing letter.

As used herein, the terms "comprise," "comprises," and "comprising" may be used interchangeably with "include," "includes," or "including." As used herein, "exemplary" indicates an example, an implementation, and/or an aspect, and should not be construed as limiting or as indicating a preference or a preferred implementation. As used herein, an ordinal term (e.g., "first," "second," "third," etc.) used to modify an element, such as a structure, a component, an operation, etc., does not by itself indicate any priority or order of the element with respect to another element, but rather merely distinguishes the element from another element having a same name (but for use of the ordinal term). As used herein, the term "set" refers to one or more of a particular element, and the term "plurality" refers to multiple (e.g., two or more) of a particular element.

Improvements in manufacturing technology and demand for lower cost and more capable electronic devices has led to increasing complexity of ICs. Often, more complex ICs have more complex interconnection schemes to enable interaction between ICs of a device. The number of interconnect levels for circuitry has substantially increased due to the large number of devices that are now interconnected in a state-of-the-art mobile application device.

These interconnections include back-end-of-line (BEOL) interconnect layers, which may refer to the conductive interconnect layers for electrically coupling to front-end-of-line (FEOL) active devices of an IC. The various BEOL interconnect layers are formed at corresponding BEOL interconnect levels, in which lower BEOL interconnect levels generally use thinner metal layers relative to upper BEOL interconnect levels. The BEOL interconnect layers may electrically couple to middle-of-line (MOL) interconnect layers, which interconnect to the FEOL active devices of an IC.

State-of-the-art mobile application devices demand a small form factor, low cost, a tight power budget, and high electrical performance. Mobile package design has evolved to meet these divergent goals for enabling mobile applications that support multimedia enhancements. For example, fan-out (FO) wafer level packaging (WLP) or FO-WLP process technology is a development in packaging technology that is useful for mobile applications. A chip-first FO-WLP process technology solution provides flexibility to fan-in and fan-out connections from a die to package balls. In addition, this solution also provides a height reduction of a first level interconnect between the die and the package balls of mobile application devices. These mobile applications, however, are susceptible to power and signal routing issues when multiple dies are arranged within the small form factor.

As used herein, the term "layer" includes a film, and is not construed as indicating a vertical or horizontal thickness unless otherwise stated. As used herein, the term "chiplet" may refer to an integrated circuit block, a functional circuit block, or other like circuit block specifically designed to work with one or more other chiplets to form a larger, more complex chiplet architecture.

A 3D integrated circuit (3D IC) includes a set of stacked and interconnected dies. Generally, a 3D IC architecture can achieve higher performance, increased functionality, lower power consumption, and/or smaller footprint, as compared to providing the same circuitry in a monolithic die or in a two-dimensional (2D) IC structure. Unfortunately, capacitive decoupling for power distribution networks (PDNs) of 3D ICs to suppress power distribution noise is challenging. In particular, the available space for landside capacitors (LSCs) under a die shadow in a 3D IC is limited due to the smaller footprint of 3D ICs. For example, different logic blocks of a 3D IC may be placed to overlap each other in the stacked dies, making it even more challenging to provide decoupling for the circuitry in the stacked dies. In addition, an electrical path of the traditional landside capacitor placement on a package substrate may exhibit larger inductance parasitics, which may degrade the landside capacitor decoupling performance.

In a particular aspect, an integrated device substrate includes one or more embedded electromagnetic (EM) isolation structures. Each EM isolation structure at least partially encircles a conductor that is to be isolated from other structures of the integrated device substrate. Each EM isolation structure includes one or more conductive wall vias that extend between two or more metal layers of the integrated device structure.

The EM isolation structures disclosed herein can be formed using relatively low-cost manufacturing processes, such as photolithography, metal deposition, and dielectric layering. Using photolithographic processes to form openings during fabrication of the EM isolation structures enables the formation of smaller features as compared, for example, to features formed by processes such as laser drilling or mechanical drilling. As a result, the EM isolation structures can be relatively small and have little impact on the overall dimensions of the integrated device substrate. In some instances, using the EM isolation structures can enable use of smaller traces, more closely spaced traces, and/or more closely spaced conductive vias, further reducing the impact on the overall dimensions of the integrated device substrate due to the EM isolation structures. Additionally, the EM isolation structure can provide significant performance improvements by controlling impedance. For example, one or more EM isolation structures can be used to isolate signal paths to improve signal integrity, reduce crosstalk, and reduce electromagnetic emissions, etc. As another example, one or more EM isolation structures can be used to reduce impedance to improve power distribution network performance.

Exemplary Integrated Device Substrate Including EM Isolation Structure(s)

FIGS. 1A-1D show schematic cross-sectional profile views of various examples of an integrated device that includes a substrate 100 having an embedded electromagnetic (EM) isolation structure for one or more conductors 140. The one or more conductors 140 can include, for example, one or more conductive traces, one or more via pads, one or more conductive vias, or combinations thereof.

In each of FIGS. 1A-ID, the substrate 100 is illustrated as including a plurality of metal layers (e.g., metal layer 102, metal layer 104, metal layer 106, and metal layer 108) separated by dielectric layers (e.g., dielectric layer 112, dielectric layer 114, and dielectric layer 116). Four metal layers 102-108 separated by three dielectric layers 112-116 are illustrated merely as one example. In other examples, the substrate 100 includes more than four metal layers or fewer than four metal layers, and correspondingly more than three dielectric layers or fewer than three dielectric layers. The metal layers 102-108 are patterned to form a variety of conductive features, such as pads and traces, and are interconnected at various locations by conductive vias that extend through one or more of the dielectric layers 112-116.

The bottom metal layer (e.g., metal layer 102 in the orientation illustrated in FIGS. 1A-1D) of the substrate 100 may be disposed on a substructure 110. In some embodiments, the substructure 110 includes a carrier layer, such as a carrier wafer, upon which the substrate 100 is formed. In some embodiments, the substructure 110 includes a laminate substrate, such as a cored or coreless laminate substrate. For example, in either of these embodiments, the substrate 100 can be built-up, layer-by-layer, on the substructure 110 using various deposition and patterning operations. In still other embodiments, the substructure 110 can be omitted from the substrate 100, or the substructure 110 can be separated from the substructure 110 as part of a fabrication process. When the substructure 110 is present, the substructure 110 can include additional metal layers, conductive interconnects, passive or active circuit components, etc. For example, the substructure 110 can include conductors that are electrically connected to the bottom metal layer (e.g., metal layer 102) to enable routing of power, ground, and/or signals to or from the substructure 110 via the substructure 110. To illustrate, the substructure 110 can include conductive interconnects to enable electrically connecting a die, a chiplet, or another circuit component coupled to the substrate 100 to one or more other dies, chiplets, or other circuit components coupled to the substructure 110.

In the example illustrated in FIG. 1A, the one or more conductors 140 include a conductor 142 of the metal layer 106. The conductor 142 in FIG. 1A includes a conductive trace; however, in other examples, the conductor 142 is another conductive feature of the metal layer 106, such as a via pad.

In FIG. 1A, the EM isolation structure 120 of the substrate 100A includes one or more conductors 124 in the metal layer 104, one or more conductors 132 in the metal layer 108, and two or more conductive wall stacks 122 (including a conductive wall stack 122A and a conductive wall stack 122B). Each of the conductive wall stacks 122 includes a conductive wall via 126 electrically connected to the one or more conductors 124 and electrically connected to a conductive wall via pad 128 in the metal layer 106. Further, a conductive wall via 130 is electrically connected to the conductive wall via pad 128 in the metal layer 106 and electrically connected to the one or more conductors 132 in the metal layer 108. In this context, a "conductive wall via" refers to a conductive structure that extends in a first direction to electrically connect features of two or more of the metal layers 102-108 (i.e., is a via) and that is extended or elongated along one or more other directions perpendicular to a first direction to define a barrier (i.e., is a wall). Similarly, a "conductive wall stack" in this context refers to two or more conductive wall vias that are stacked (e.g., vertically aligned in the orientation illustrated in FIGS. 1A-ID such that their projections intersect or nearly intersect) to extend between more than two metal layers. Although the conductive wall stacks o of FIG. 1A extend across three metal layers (e.g., the metal layers 104-108) in FIG. 1A, in other examples, the conductive wall stacks 122 can extend across more than three metal layers. To illustrate, in some embodiments, the one or more conductors 140 are disposed in two or more different metal layers, and the conductive wall stacks 122 extend across at least the same metal layers as the one or more conductors 140.

Figure 2:
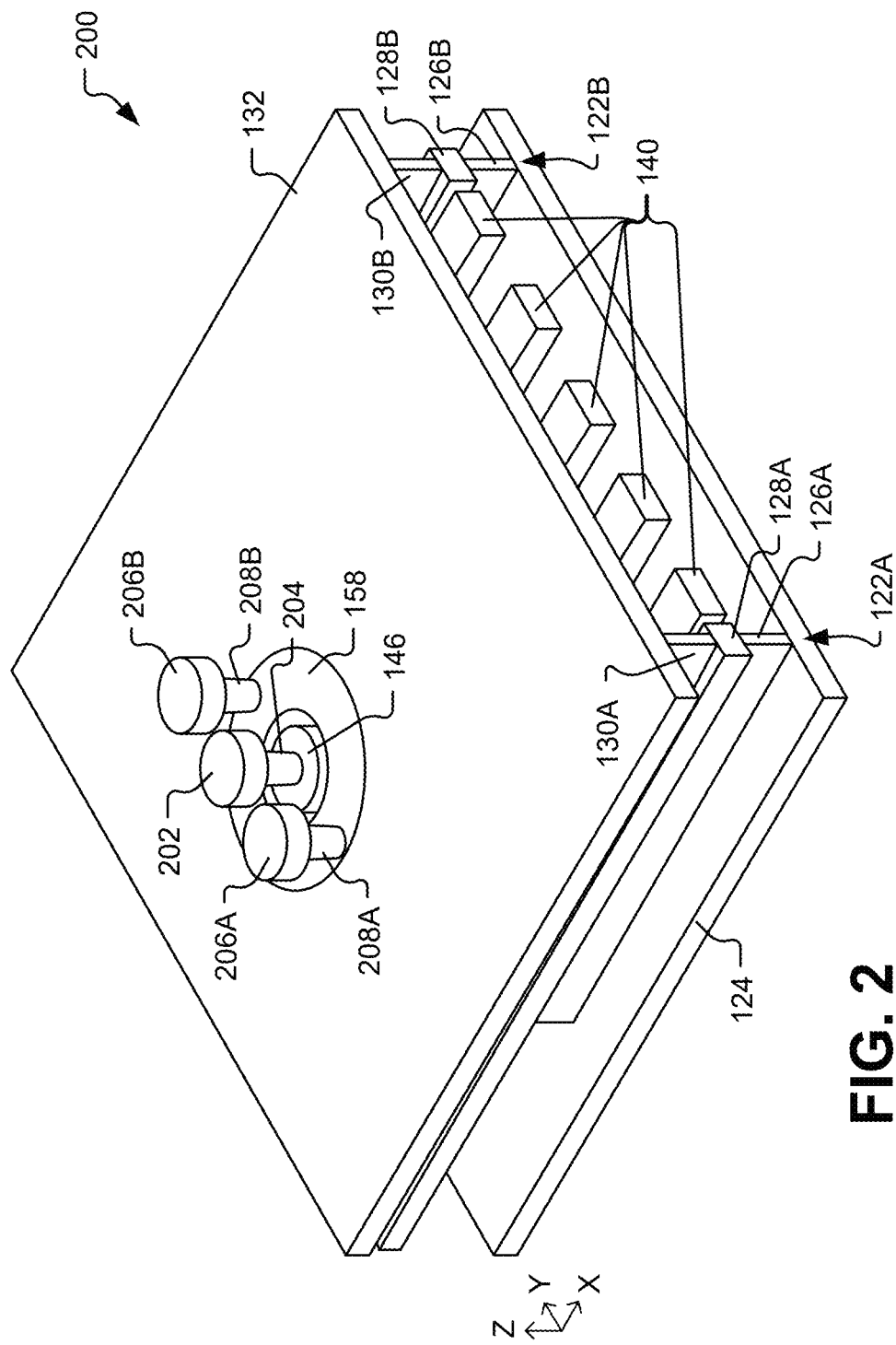
FIG. 2 illustrates a schematic perspective view of an example of an EM isolation structure that can be disposed within a substrate.
Figure 3:
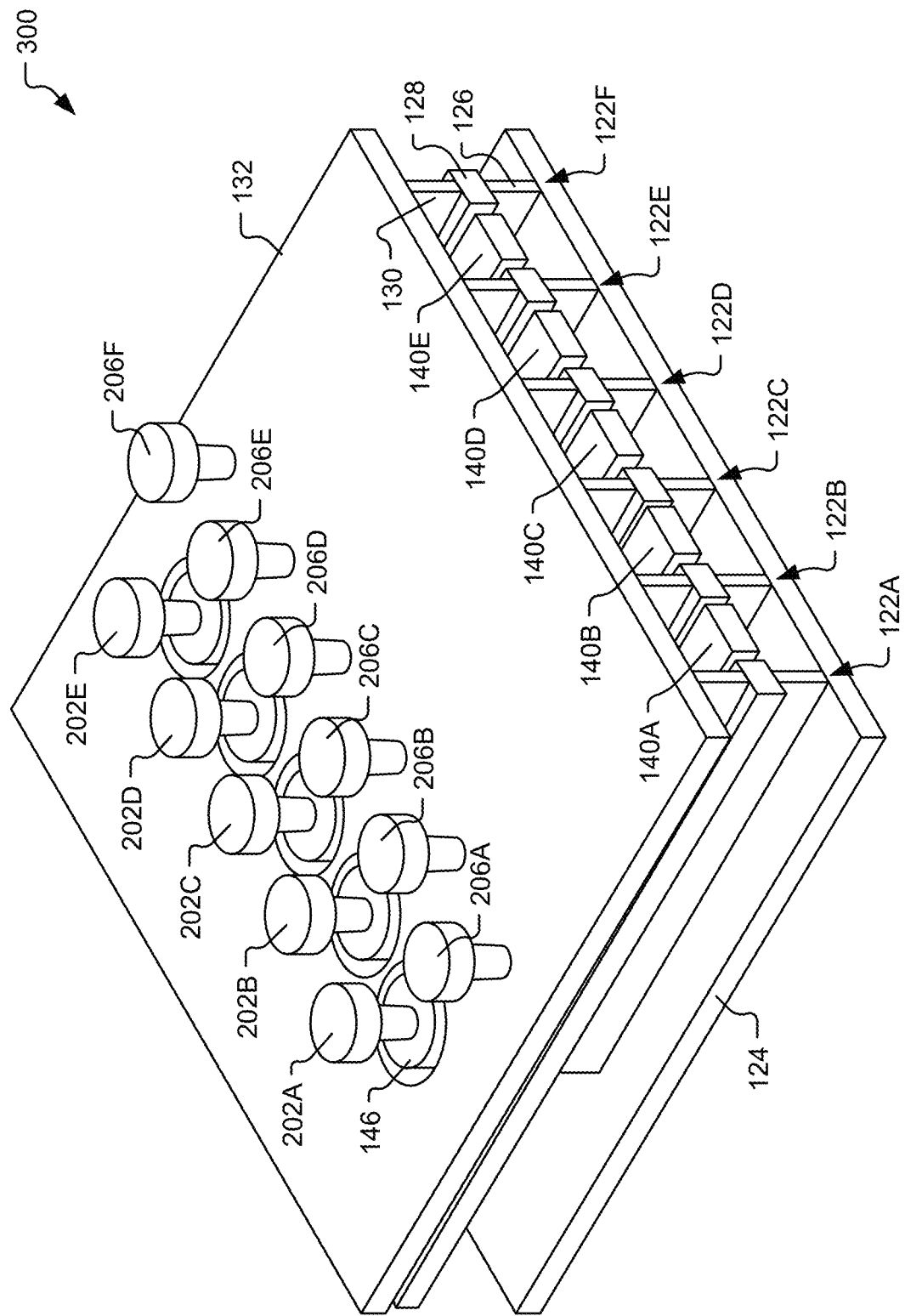
FIG. 3 illustrates a schematic perspective view of an example of an EM isolation structure that can be disposed within a substrate.

To form the EM isolation structure 120, one of the conductive walls stacks 122 (e.g., the conductive wall stack 122A) is disposed on a first side of the one or more conductors 140, and another of the conductive walls stacks 122 (e.g., the conductive wall stack 122B) is disposed on a second side (e.g., on the opposite side) of the one or more conductors 140. The conductive wall vias 126, 130, extend along a length of at least a portion of the one or more conductors 140 to form a conductive barrier between the one or more conductors 140 and other features of the metal layers 104-108 of the substrate 100. In some embodiments, the conductor 124 is electrically connected to both the conductive wall stack 122A and the conductive wall stack 122B to form a conductive barrier between the one or more conductors 140 and features of the metal layer 102 and/or features thereunder (e.g., features of the substructure 110 or other components electrically connected to the substructure or the metal layer 102). In some embodiments, the conductor 132 is electrically connected to both the conductive wall stack 122A and the conductive wall stack 122B to form a conductive barrier between the one or more conductors 140 and features over the metal layer 108 (e.g., features of metal layers over a dielectric layer 118 or components electrically connected to the metal layer 108). In some embodiments, the conductor 124, the conductor 132, or both, extend along a length of at least a portion of the one or more conductors (e.g., the conductor 142 in FIG. 1A). For example, as illustrated in FIGS. 2 and 3, the conductor 124, the conductor 132, or both, can include a conductive sheet arranged such that the one or more conductors 140 are enclosed within the EM isolation structure 120 along at least a portion of the length of the one or more conductors 140.

In FIG. 1B, the one or more conductors 140 include at least one conductive via (e.g., conductive via 144) between two or more of the metal layers 102-108. For example, in the example illustrated in FIG. 1B, the one or more conductors 140 include the conductor 142 (e.g., a conductive trace or a via pad) in the metal layer 106, a conductor 146 (e.g., a conductive trace or a via pad) in the metal layer 108, and the conductive via 144 therebetween.

The EM isolation structure 150 of the substrate 100B of FIG. 1B includes one or more conductive walls 152 (including conductive wall 152A and conductive wall 152B) around the one or more conductors 140. Although the conductive walls 152A and 152B are labeled separately in FIG. 1B, in some embodiments, the conductive walls 152A and 152B are unitary or joined, as illustrated in various examples illustrated in FIGS. 4-6.

Each of the conductive wall(s) 152 includes a conductive wall via 156. Together, the conductive wall via(s) 156 of the conductive walls(s) 152 at least partially encircle the conductive via 144. For example, the conductive wall via(s) 156 can include a curved portion having a concave face on a side proximate the conductive via 144. In this example, the curved portion of each of the conductive wall via(s) 156 defines an arc to at least partially encircle the conductive via 144. In various examples, the arc can span at least 90 degrees, at least 180 degrees, or at least 270 degrees. In some examples, the conductive wall via 156 fully encircles the conductive via 144 (e.g., the arc spans 360 degrees). Thus, the conductive wall(s) 152 form a conductive barrier between the one or more conductors 140 and features of the metal layer 106.

Although the conductive wall(s) 152 of FIG. 1B extend between two adjacent metal layers (e.g., the metal layers 106 and 108 in FIG. 1A), in other examples, the conductive wall(s) 152 can extend across more than two metal layers. To illustrate, in some embodiments, the one or more conductors 140 can include a via stack that extends from the metal layer 104 to the metal layer 108, in which case the EM isolation structure 150 can include conductive wall stack(s) that extend between the metal layer 104 and the metal layer 108 or some other set of metal layers.

FIG. 1C illustrates an example of a substrate 100C that includes both the EM isolation structure 120 and the EM isolation structure 150. For example, the EM isolation structure 120 can define conductive wall stacks that extend along a length of at least one of the one or more conductors 140, and the EM isolation structure 150 can include one or more conductive via walls that at least partially encircle a conductive via of the one or more conductors 140. Although FIG. 1B illustrates a single instance of each of the EM isolation structures 120 and 150, in other examples, the substrate 100C can include more than one EM isolation structure 120, more than one EM isolation structure 150, or more than one of each.

Figure 1D:
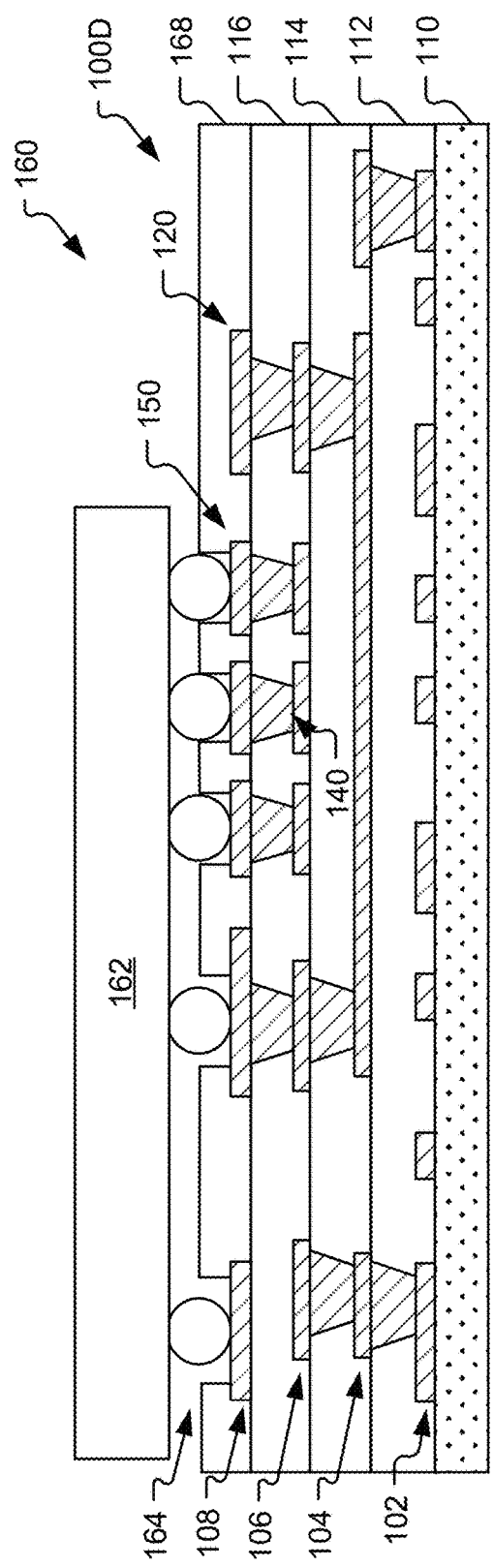
FIG. 1D illustrates a schematic cross-sectional profile view of another example of an integrated device including a substrate having an embedded EM isolation structure for one or more conductors.

FIG. 1D illustrates an example of an integrated device 160 that includes an electronic device 162 electrically connected to a substrate 100D that includes one or more EM isolation structures. In the example illustrated in FIG. 1D, the substrate 100D includes both the EM isolation structure 120 and the EM isolation structure 150 around the one or more conductors 140. In other examples, the substrate 100D omits the EM isolation structure 120 or the EM isolation structure 150. In still other examples, the substrate 100D includes more than one EM isolation structure 120, more than one EM isolation structure 150, or more than one of each.

In FIG. 1D, a solder resist layer 168 overlies the metal layer 108 and defines openings for electrical interconnects 164 that electrically connect the electronic device 162 to the substrate 100D. In other examples, the substrate 100D includes one or more additional metal layers between an upper metal layer of an EM isolation structure 120 or 150 and a topmost metal layer electrically connected to the electronic device 162. In other words, one or more of the EM isolation structures 120, 150 can be disposed lower in a stack of layers than illustrated in FIG. 1D. The electronic device 162 can include one or more dies, one or more chiplets, one or more packaged integrated circuit devices, other electronic devices, or combinations thereof.

In each of FIGS. 1A-1D, the particular EM isolation structure(s) 120, 150 illustrated can isolate signal paths to improve signal integrity, reduce crosstalk, and reduce electromagnetic emissions, etc. For example, the EM isolation structure(s) 120, 150 can be electrically connected to a reference voltage conductor (e.g., power, ground, etc.) of the substrate 100. In this example, the one or more conductors 140 shielded by the EM isolation structure(s) 120, 150 can be used as shielded signal paths which are protected against cross-talk and other types signal interference by the EM isolation structure(s) 120, 150. The EM isolation structure(s) 120, 150 can also, or alternatively, improve power distribution network performance by controlling impedance along signal paths of the power distribution network.

FIGS. 2-7 illustrate various examples of EM isolation structures that can be disposed within a substrate. In each of FIGS. 2-7, only conductive (e.g., metal) portions of the respective EM isolation structure are shown; however, each of the EM isolation structures includes features of several metal layers that are separated from one another by dielectric layers, as described with reference to FIGS. 1A-1D. Dielectric layers are omitted from FIGS. 2-7 to simplify illustration of aspects of the EM isolation structures.

FIG. 2 illustrates a schematic perspective view of an example of an EM isolation structure 200 that can be disposed within a substrate. The EM isolation structure 200 of FIG. 2 includes both the EM isolation structure 120 and the EM isolation structure 150 of FIGS. 1A-1D. For example, the EM isolation structure 200 includes the conductive wall stack 122A on a side of the one or more conductors 140, and the conductive wall stack 122B on a side of the one or more conductors 140 opposite the conductive wall stack 122A. The EM isolation structure 200 also includes the conductor 132 and the conductor 124, which is electrically connected to the conductive wall stacks 122. The conductor 132 and the conductor 124 in FIG. 2 are extended in two dimensions (e.g., along an X-direction and a Y-direction in FIG. 2) to define a sheet or conductive plane. Together, the conductive wall stacks 122 and the conductors 132, 124 correspond to an example of the EM isolation structure 120 of FIGS. 1A, 1C, and 1D enclosing the conductor(s) 140 along at least a portion of the length along the conductor(s) 140 (e.g., along the X-direction).

The EM isolation structure 200 of FIG. 2 also includes a conductor 146, which is electrically connected to a conductive via 144 (shown in FIG. 1B, but not visible in the view shown in FIG. 2). The EM isolation structure 200 of FIG. 2 also includes a conductor 158, which is electrically connected to a conductive wall via 156 (shown in FIG. 1B, but not visible in the view shown in FIG. 2). Together, the conductor 158, the conductive wall via 156 of FIG. 1B and the conductor 154 of FIG. 1B correspond to an example of the EM isolation structure 150 of FIGS. 1B-1D at least partially encircling the conductive via 144 electrically connected to the conductor(s) 146.

In FIG. 2, a first contact 202 is electrically connected to the conductor 146 by a conductive via 204, and one or more contacts 206 (including contact 206A and contact 206B in FIG. 2) are connected to the conductor 158 by one or more conductive vias 208 (including conductive via 208A and conductive via 208B in FIG. 2). In some embodiments, the contact 202 is configured to be electrically connected to a signal path (e.g., a power connector, a ground connector, or an input/output (I/O) connector) of an electronic device, such as the electronic device 162 of FIG. 1D. In such embodiments, the contact(s) 206 are configured to be electrically connected to another a reference voltage source, such as a reference ground.

In some embodiments, the conductor 158 is part of the conductor 132. In other embodiments, the conductor 158 is separated from the conductor 132 by a region (e.g., a ring) of dielectric material. In embodiments in which the conductor 158 and the conductor 132 are separate from one another, the conductor 132 can be electrically connected to a reference voltage source, and the conductor 158 can be electrically connected to the same reference voltage source or to a different reference voltage source.

In the example illustrated in FIG. 2, the conductor(s) 140 shielded by the EM isolation structure 200 include five traces. In other examples, the EM isolation structure 200 can be used to shield more than five conductors 140 or fewer than five conductors 140. In the example illustrated in FIG. 2, the sizes of the conductors 132, 124 relative to the conductive wall stacks 122 is merely illustrative. For example, although the conductor 132 and the conductor 124 extend beyond the conductive wall vias 126, 130 of the conductive wall stacks 122 in FIG. 2, in other examples, one or more of the conductive wall vias 126 extend to the full length of the conductor 132, the conductor 124, or both. Similarly, the sizes of the conductive wall via pads 128 relative to the conductive wall vias 130, 126 are merely illustrative and can be different in other embodiments.

FIG. 3 illustrates a schematic perspective view of an example of an EM isolation structure 300 that can be disposed within a substrate. The EM isolation structure 300 of FIG. 3 differs from the EM isolation structure 200 of FIG. 2 in that the EM isolation structure 300 includes conductive wall stacks 122 between pairs of adjacent conductors 140. Additionally, the EM isolation structure 300 includes a contact 202 electrically connected to each of the conductors 140, and a set of contacts 206 electrically connected to the EM isolation structure 300.

In FIG. 3, the EM isolation structure 300 includes both the EM isolation structure 120 and the EM isolation structure 150 of FIGS. 1A-1D. For example, the EM isolation structure 300 includes the conductive wall stack 122A on a side of conductor 140A, the conductive wall stack 122B between conductors 140A and 140B, the conductive wall stack 122C between conductors 140B and 140C, the conductive wall stack 122D between conductors 140C and 140D, the conductive wall stack 122E between conductors 140D and 140E, and the conductive wall stack 122F on a side of the conductor 140E opposite the conductive wall stack 122E. Each of the conductive wall stacks includes a conductive wall via 126 electrically connected to the conductor 124, a conductive wall via pad 128 electrically connected to the conductive wall via 126, and a conductive wall via 130 electrically connected to the conductive wall via pad 128 and to the conductor 132. The conductors 124, 132 are arranged as conductive sheets or conductive planes in FIG. 3. Together, an adjacent pair of conductive wall stacks 122 and the conductors 132, 124 correspond to an example of the EM isolation structure 120 of FIGS. 1A, 1C, and 1D enclosing one of the conductors 140 along at least a portion of the length along the conductor 140.

Each of the contacts 202 of FIG. 3 is electrically connected to a corresponding conductor 146, which is electrically connected, by way of one or more conductive vias (e.g., conductive via 144 of FIG. 1B) to a corresponding one of the conductors 140. In some embodiments, one or more of the conductive vias connecting a contact to a conductor 140 is shielded by an EM isolation structure similar to the EM isolation structure 150 of FIG. 1B. For example, a conductive wall via can be electrically connected to the conductor 132 and can at least partially encircle the conductive via. This arrangement is similar to the arrangement described with reference to FIG. 2, except that in FIG. 3 the conductor 158 of FIG. 2 is integral with the conductor 132 of FIG. 3 and is therefore not illustrated separately.

In the example illustrated in FIG. 3, five traces (e.g., conductors 140A-140E) are shielded by the EM isolation structure 300; however, in other examples, the EM isolation structure 300 is configured to shield more than five conductors 140 or fewer than five conductors 140. Further, in FIG. 3, the sizes of the various features relative to one another are merely illustrative.

Figure 4:
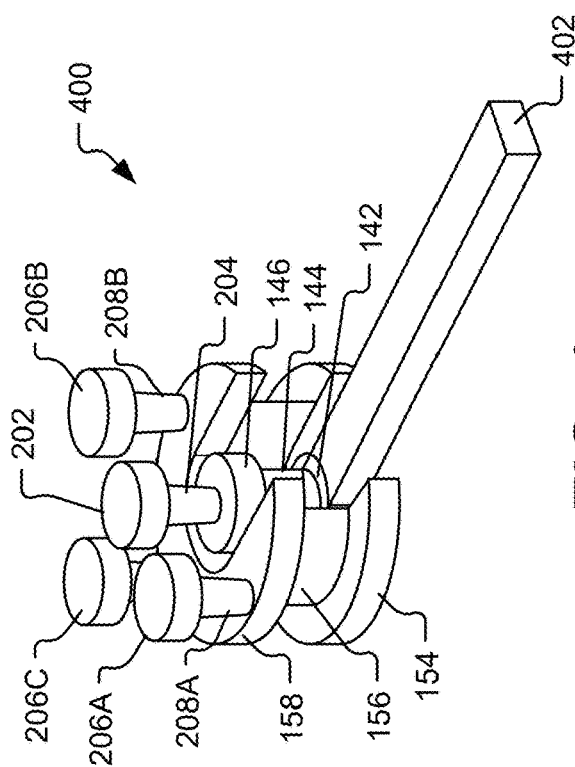
FIG. 4 illustrates a schematic perspective view of an example of an EM isolation structure that can be disposed within a substrate.

FIG. 4 illustrates a schematic perspective view of an example of an EM isolation structure 400 that can be disposed within a substrate. The EM isolation structure 400 of FIG. 4 is an example of the EM isolation structure 150 of FIGS. 1B-1D. For example, the EM isolation structure 400 includes a conductor 146, which is electrically connected to a conductor 142 by a conductive via 144. The EM isolation structure 400 also includes a conductor 158, which is electrically connected to a conductor 154 by a conductive wall via 156. Together, the conductor 158, the conductive wall via 156, and the conductor 154 correspond to an example of the EM isolation structure 150 of FIGS. 1B-1D at least partially encircling one or more conductors including the conductor 146, the conductive via 144, and the conductor 142.

In FIG. 4, a contact 202 is electrically connected to the conductor 146 by a conductive via 204, and one or more contacts 206 (including contact 206A, contact 206B, and contact 206C) are connected to the conductor 158 by one or more conductive vias 208 (including conductive via 208A, conductive via 208B, and conductive via 208C). In some embodiments, the contact 202 is configured to be electrically connected to a signal path (e.g., a power connector, a ground connector, or an input/output (I/O) connector) of an electronic device, such as the electronic device 162 of FIG. 1D. In such embodiments, the contact(s) 206 are configured to be electrically connected to another reference voltage source, such as a reference ground.

In some embodiments, the conductor 158 of FIG. 4 is part of the conductor 132 of FIG. 1A. In the example illustrated in FIG. 4, the EM isolation structure 400 is formed around a single conductive via 144; however, in other embodiments, the EM isolation structure 400 can at least partially enclose two or more conductive vias of a via stack.

In the example illustrated in FIG. 4, the conductor 154 defines an incomplete ring-shape, which defines an opening for a conductive trace 402 to be electrically connected to the conductor 142. The conductor 158 of FIG. 4 has the same shape as the conductor 154. Accordingly, in some embodiments, another conductive trace (not shown) can pass through the opening of the conductor 158 to be electrically connected to the conductor 146. Alternatively, the conductor 158 can fully encircle the conductor 146, as illustrated in the example of FIG. 5.

Figure 5:
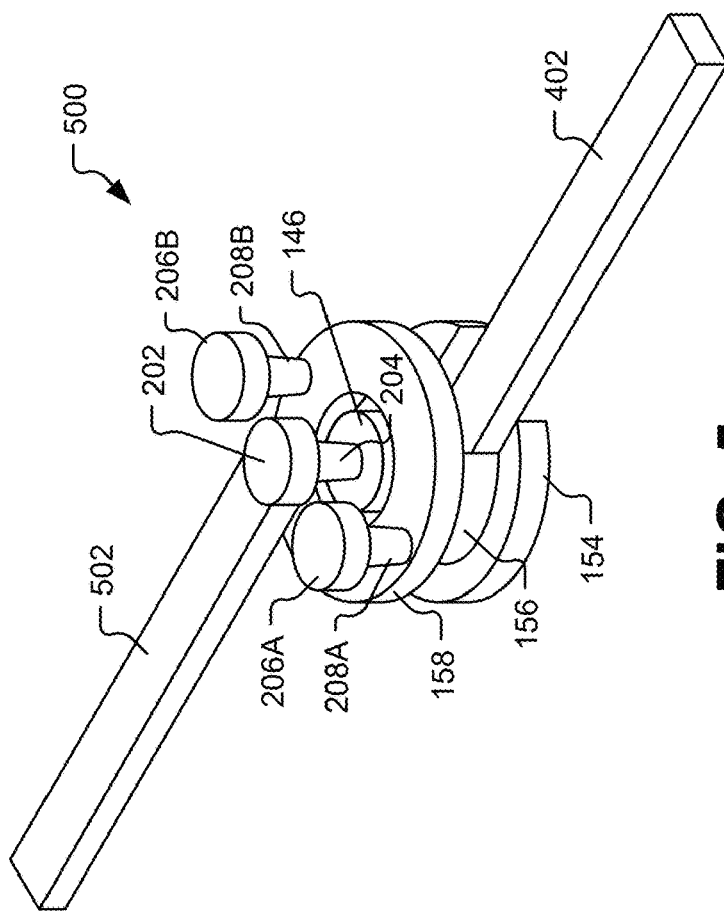
FIG. 5 illustrates a schematic perspective view of an example of an EM isolation structure that can be disposed within a substrate.

FIG. 5 illustrates a schematic perspective view of an example of an EM isolation structure 500 that can be disposed within a substrate. The EM isolation structure 500 of FIG. 5 differs from the EM isolation structure 400 of FIG. 4 in that the conductor 158 of the EM isolation structure 500 fully encircles the conductor 146 and the EM isolation structure 500 includes a conductor 502 electrically connected to the contact 202. Further, the contact 206C (and its corresponding conductive via connected to the conductor 158) of FIG. 4 are omitted.

FIGS. 6A-6F illustrate schematic top views of various examples of configurations of the EM isolation structure 150 of FIGS. 1B-1D. The examples illustrated in FIGS. 6A-6F represent only a few of the possible configurations of the EM isolation structure 150.

Figure 6A:
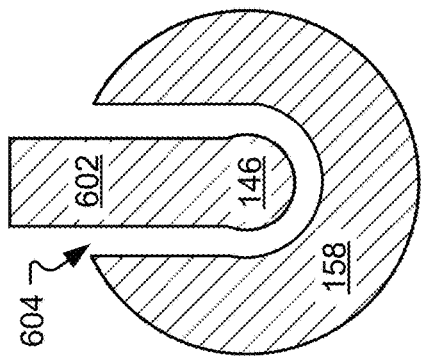
FIGS. 6A, 6B, 6C, 6D, 6E, and 6F illustrate a schematic top views of examples of EM isolation structures that can be disposed within a substrate.
Figure 6B:
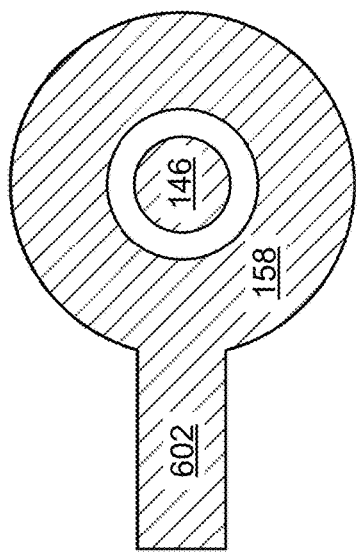

In the example of FIG. 6A, the conductor 158 fully encircles the conductor 146. In the example of FIG. 6B, the conductor 158 fully encircles the conductor 146 and a conductive trace 602 is electrically connected to the conductor 158. For example, the conductive trace 602 of FIG. 6B can be configured to electrically connect the conductor 158 to a reference voltage source.

Figure 6C:
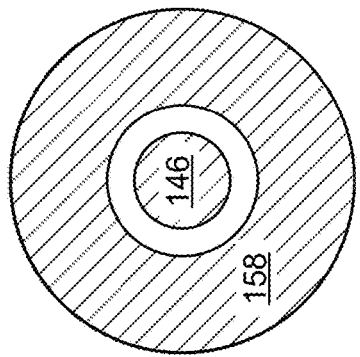
Figure 6D:
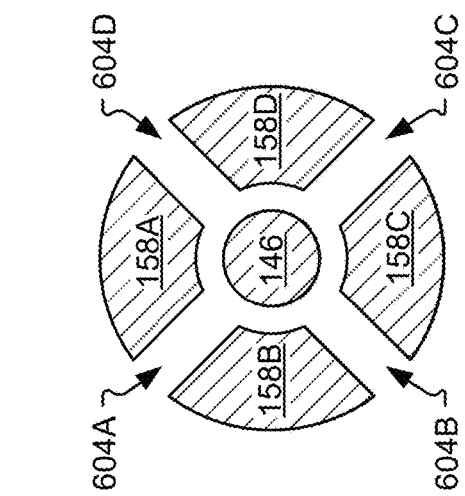
Figure 6E:
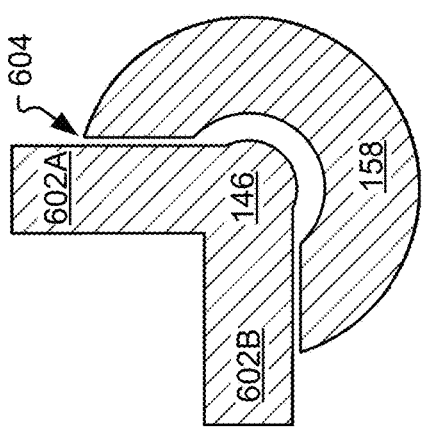
Figure 6F:
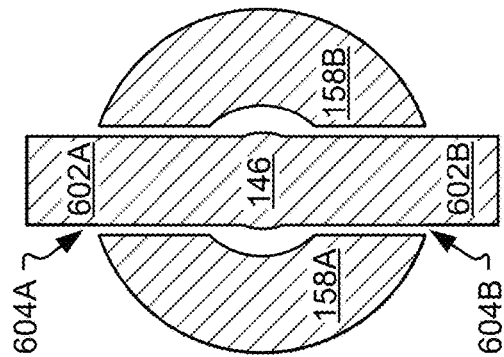

In each of the examples of FIG. 6C-6F, the conductor 158 partially encircles the conductor 146. In the example of FIG. 6C, the conductor 158 defines an opening 604, and a conductive trace 602 extends through the opening to electrically connect to the conductor 146. In the example of FIG. 6D, the conductor 158 is divided into two portions (e.g., conductor 158A and conductor 158B) to define a first opening 604A through which a conductive trace 602A extends to electrically connect to the conductor 146 and a second opening 604B through which a conductive trace 602B extends to electrically connect to the conductor 146. In the example of FIG. 6E, the conductor 158 defines an opening 604 through which two conductive traces 602A, 602B extends to electrically connect to the conductor 146. In the example of FIG. 6F, the conductor 158 is divided into multiple portions (e.g., conductor 158A, conductor 158B, conductor 158C, and conductor 158D) to define multiple openings 604 (e.g., opening 604A, opening 604B, opening 604C, and opening 604D). Although no conductive traces are illustrated in FIG. 6F, in some embodiments, one or more conductive traces extend through one or more of the openings 604 to electrically connect to the conductor 146. Further, although the conductor 158 is divided into four portions to define four openings 604 in FIG. 6F, in other examples, the conductor 158 is divided into more than four or fewer than four portions and defines more than four or fewer than four openings 604.

Additionally, while FIGS. 6A-6F illustrate examples of top views of the EM isolation structure 150, the configurations shown could represent bottom views of the EM isolation structure 150 by replacing references to the conductor 146 with references to the conductor 142 and replacing references to the conductor 158 with references to the conductor 154. Similarly, except as may be limited due to processing constraints, the configurations shown could represent top or bottom views of conductive wall vias 156 of the EM isolation structure 150 by replacing references to the conductor 146 with references to the conductive via 144, replacing references to the conductor 158 with references to the conductive wall via 156, and omitting conductive traces 602.

Figure 7:
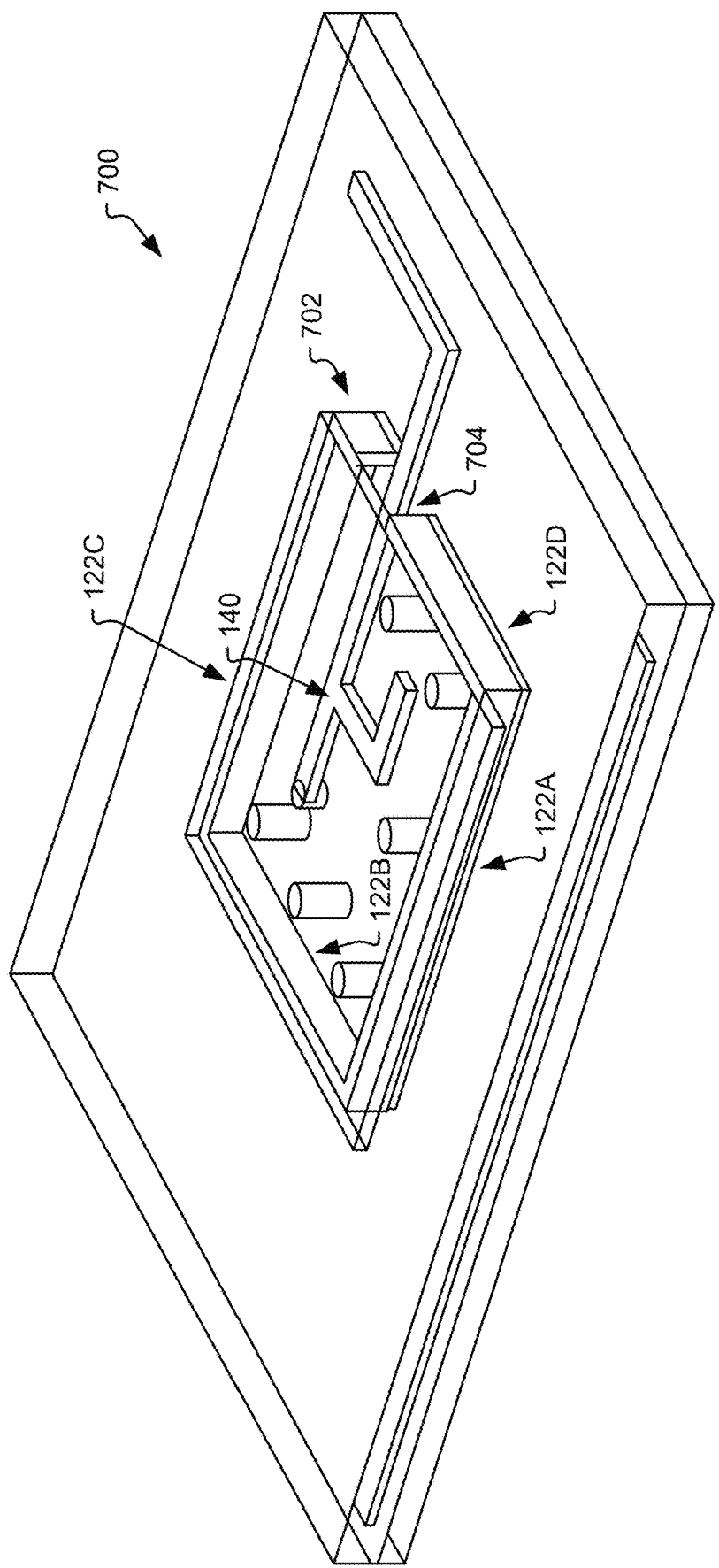
FIG. 7 illustrates a schematic perspective view of an example of an EM isolation structure that can be disposed within a substrate.

FIG. 7 illustrates a schematic perspective view of a substrate 700 including an example of an EM isolation structure 702. The EM isolation structure 702 is an example of the EM isolation structure 120 of FIGS. 1A-1D. For example, the EM isolation structure 702 includes a conductive wall stack 122A on a side of the one or more conductors 140 and a conductive wall stack 122C on a side of the one or more conductors 140 opposite the conductive wall stack 122A. Additionally, the EM isolation structure 702 includes a conductive wall stack 122B on a side of the one or more conductors 140 perpendicular to the conductive wall stacks 122A and 122C, and a conductive wall stack 122D on a side of the one or more conductors 140 opposite the conductive wall stack 122B. An opening 704 is defined in the conductive wall stack 122D to enable a portion of the conductor(s) 140 to extend into a region of the substrate 700 external to the EM isolation structure 702.

Exemplary Sequence for Fabricating an Integrated Device Substrate Including EM Isolation Structure(s)

Figure 8A:
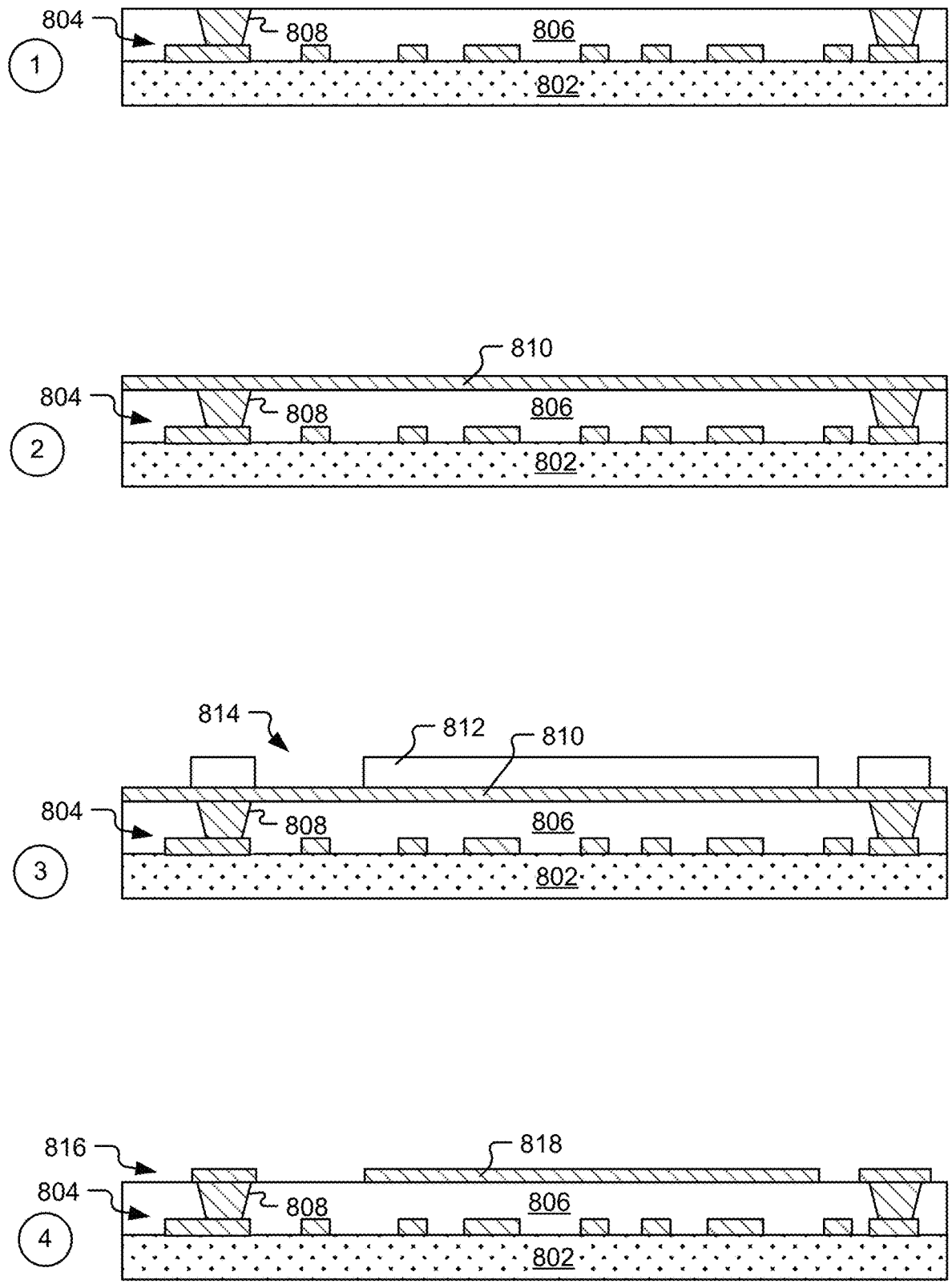
FIGS. 8A, 8B, and 8C together illustrate an exemplary sequence for fabricating an exemplary integrated device substrate having an embedded EM isolation structure.
Figure 8B:
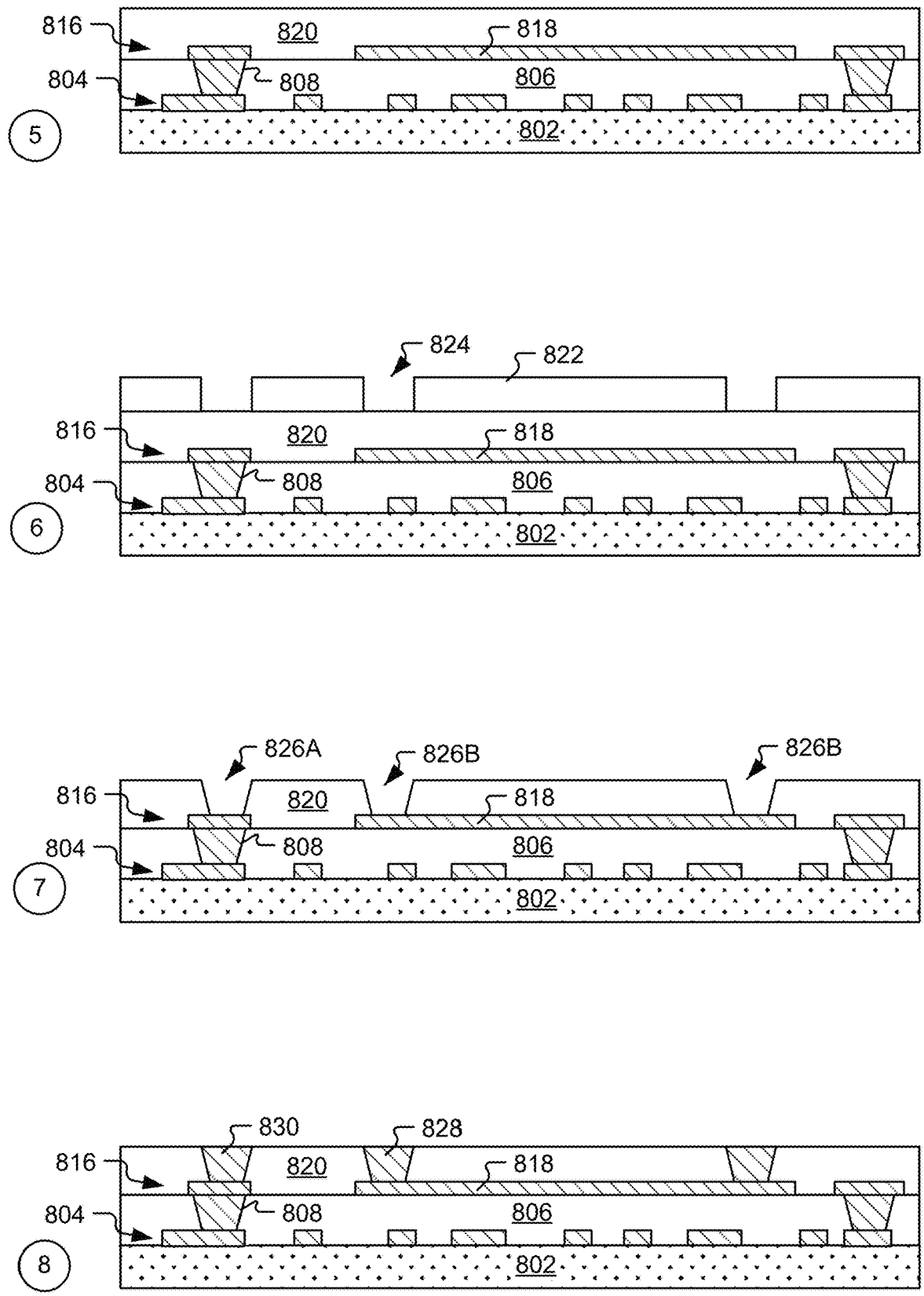
Figure 8C:
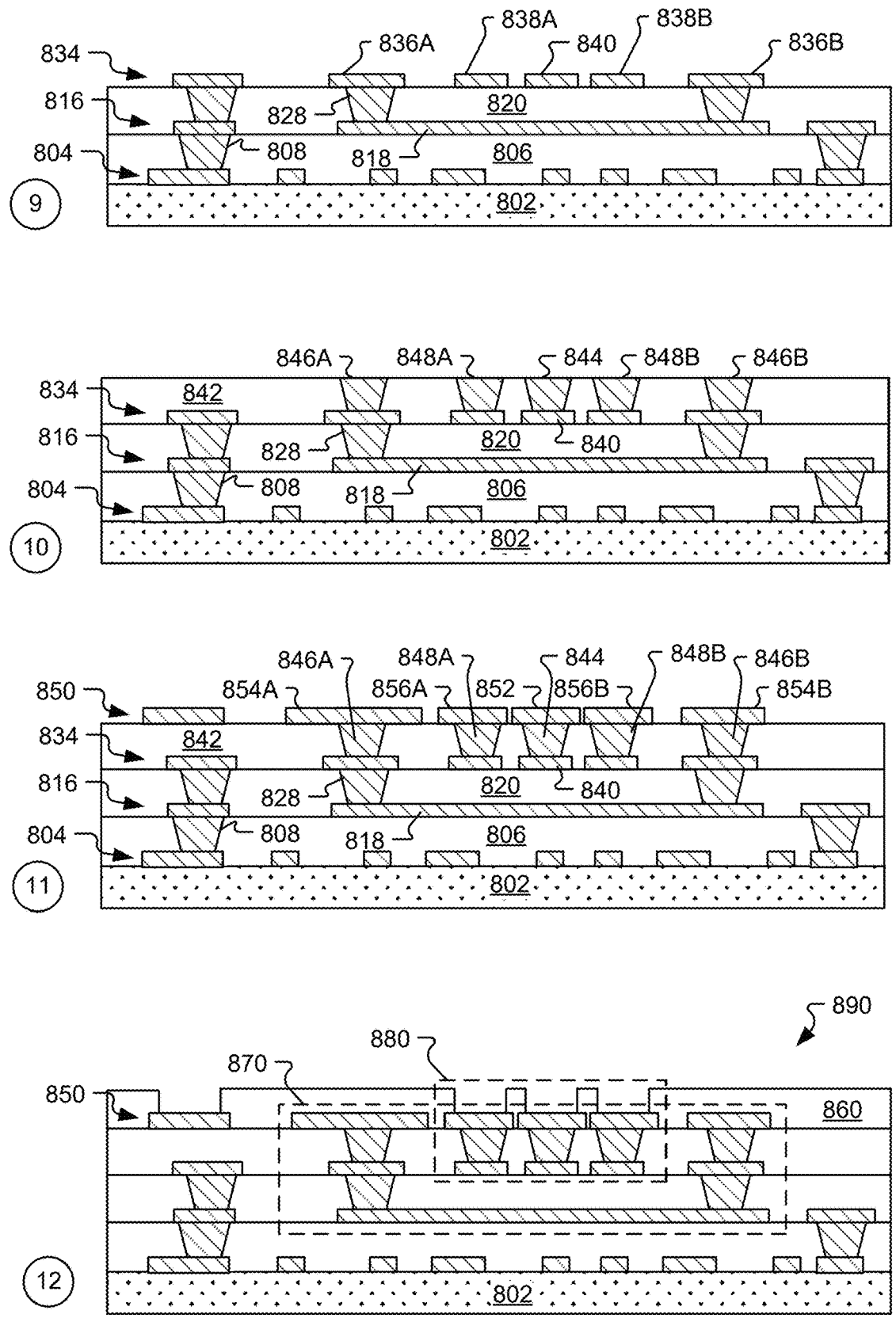

In some implementations, fabricating an integrated device substrate (e.g., the substrate 100) that includes an embedded EM isolation structure (e.g., any of the EM isolation structures 120, 150, 200, 300, 400, 500, or 700) includes several processes. FIGS. 8A-8C illustrate an exemplary sequence for providing or fabricating an integrated device substrate including one or more embedded EM isolation structures, as described with reference to any of FIGS. 1A-7. For example, the sequence of FIGS. 8A-8C can be used to provide (e.g., during fabrication of) an integrated device substrate that includes one or more of the EM isolation structures 120, 150, 200, 300, 400, 500, or 700 described with reference to FIGS. 1A-7.

It should be noted that the sequence of FIGS. 8A-8C may combine one or more stages in order to simplify and/or clarify the sequence for providing or fabricating an integrated device substrate that includes an EM isolation structure. In some implementations, the order of the processes may be changed or modified. In some implementations, one or more of the processes may be replaced or substituted without departing from the scope of the disclosure. In the following description, reference is made to various illustrative Stages of the sequence, which are numbered (using circled numbers) in FIGS. 8A-8C.

Stage 1 of FIG. 8A illustrates a state after one or more metal layers (e.g. a metal layer 804) and one or more dielectric layers (e.g., a dielectric layer 806) are formed on a substructure 802. In some embodiments, the substructure 802 includes a carrier layer, such as a carrier wafer, which can be removed when formation of the substrate is complete. In such implementations, the metal layer 804 can be attached to the substructure 802 using an adhesive layer. In other embodiments, the substructure 802 includes one or more layers that will form a portion of the substrate. In such implementations, the metal layer 804 can be formed using one or more lamination operations and/or one or more deposition operations.

In a particular embodiment, the substructure 802 corresponds to the substructure 110 of any of FIGS. 1A-1D. In this embodiment, the metal layer 804 corresponds to the metal layer 102, and the dielectric layer 806 corresponds to the dielectric layer 112. Although each of FIGS. 8A-8C shows the metal layer 804 and the dielectric layer 806, the metal layer 804 and the dielectric layer 806 are optional and are omitted in some embodiments. For example, the sequence for fabrication of FIGS. 8A-8C can be used to form a substrate in which a bottom metal layer corresponds to a bottom metal layer of the EM isolation structure. In this example, the metal layer 816 can be formed directly on the substructure 802 (without the intervening metal layer 804 and dielectric layer 806) when the metal layer 816 includes a bottom metal layer of the EM isolation structure. To illustrate, the sequence for fabrication in FIGS. 8A-8C can begin at Stage 2 with formation of the metal layer 810 on a bare substructure 802. Alternatively, the metal layer 834 can be formed directly on the substructure 802 (without the intervening metal layers 804 and 816 and dielectric layers 806 and 820) when the metal layer 816 includes a bottom metal layer of the EM isolation structure. To illustrate, the sequence for fabrication in FIGS. 8A-8C can begin at Stage 9 with formation of the metal layer 834 on the bare substructure 802.

Stage 1 also illustrates one or more conductive vias 808 formed through the dielectric layer 806. Details of formation of the conductive vias 808 are omitted since the conductive vias 808 are optional; however, in general, the conductive vias 808 can be formed using similar operations to those described below with reference to formation of conductive wall vias that form part of the EM isolation structure.

Stage 2 illustrates a state after formation of an unpatterned metal layer 810 on the dielectric layer 806 and electrically connected to the conductive vias 808. For example, the metal layer 810 can be formed using one or more metal deposition operations (e.g., plating) or one or more lamination operations.

Stage 3 illustrates a state after formation of a patterned resist layer 812 on the metal layer 810. For example, a photoresist layer can be applied to the metal layer 810 as a dry film or as a liquid or gel resin, exposed to light through a photomask to selectively form cured and uncured regions, and developed to remove the uncured regions to define openings 814 and to leave the patterned resist layer 812.

Stage 4 illustrates a state after patterning of the metal layer 810 to form a patterned metal layer 816 that includes a conductor 818. For example, one or more etch operations, guided by the patterned resist layer 812 of Stage 3, can be used to remove portions of the metal layer 810 to form the metal layer 816. The patterned resist layer 812 has also been removed at Stage 4, such as by using one or more ashing or stripping operations. In a particular embodiment, the conductor 818 corresponds to the conductor 124 of any of FIG. 1A, 2, or 3.

Stages 2-4 together illustrate one example of operations that can be used to form and pattern the metal layer 816 on the dielectric layer 806 (or directly on the substructure 802 in some embodiments). In other examples, rather than forming an unpatterned metal layer (e.g., the metal layer 810) and subsequently patterning the metal layer, the patterned resist layer 812 can be formed on the dielectric layer 806 (or the substructure 802), and metal can be deposited on the patterned resist layer 812 or in the openings 814 formed in the patterned resist layer 812 to form and pattern the metal layer 816.

Stage 5 of FIG. 8B illustrates a state after formation of a dielectric layer 820 on the metal layer 816. For example, the dielectric layer 820 can be formed on the metal layer 816 using one or more deposition operations or one or more lamination operations. To illustrate, the dielectric layer 820 can be applied as a dry film layer. In particular embodiments, the dielectric layer 820 corresponds to the dielectric layer 114 of any of FIGS. 1A-1D.

Stage 6 illustrates a state after formation of a patterned resist layer 822 on the dielectric layer 820. For example, a photoresist layer can be applied to the dielectric layer 820 as a dry film or as a liquid or gel resin, exposed to light through a photomask to selectively form cured and uncured regions, and developed to remove the uncured regions to define openings 824 and to leave the patterned resist layer 822.

Stage 7 illustrates a state after openings 826 (including one or more openings 826A and one or more openings 826B in FIG. 8B) are formed in the dielectric layer 820 and the patterned resist layer 822 is removed. For example, one or more etch operations, guided by the patterned resist layer 820 of Stage 6, can be used to remove portions of the dielectric layer 820 to form the openings 826. The patterned resist layer 822 of Stage 6 can be removed using one or more ashing or stripping operations.

Stages 5-7 together illustrate one example of operations that can be used to form and pattern the dielectric layer 820. In other examples, the openings 826 can be formed using other operations, such as machining, imprint lithography, laser ablation, etc. In some embodiments, the openings 826A are used at subsequent Stages to form conventional conductive vias (e.g., vias having a generally circular cross-section when viewed from above). The openings 826A are optional and are omitted in some embodiments. The openings 826B are used as subsequent Stages to form conductive wall vias (e.g., the conductive wall vias 126 of FIG. 1A, 2, or 3) which are extended or elongated along a direction into and/or out of the page in the cross-sectional view illustrated in FIGS. 8A-8C. Formation and patterning of resist layer(s) to guide formation the openings 826B can be performed using relatively low cost operations, despite the unusual shape of the conductive vias formed thereby.

Stage 8 illustrates a state after formation of conductive wall vias 828 within the openings 826B of Stage 7, and optionally formation of conductive vias 830 with the openings 826A of Stage 7. For example, the conductive wall vias 828, the conductive vias 830, or both, can be formed by using one or more metal deposition operations, such as plating, to deposit metal within the openings 826.

Stage 9 of FIG. 8C illustrates a state after formation and patterning of a metal layer 834 on the dielectric layer 820. The metal layer 834 can be formed and patterned using the operations described above with reference to formation and patterning of the metal layer 816 (e.g., operations described with reference to Stages 2-4). In the example illustrated in FIG. 8C, the metal layer 834 includes several conductive wall via pads 836, 838 of one or more EM isolation structures, and includes one or more conductors 840 to be shielded by the EM isolation structure(s). For example, the metal layer 834 includes a conductive wall via pad 836A corresponding to a conductive wall via pad 128 of the conductive wall stack 122A of FIG. 1A, a conductive wall via pad 836B corresponding to a conductive wall via pad 128 of the conductive wall stack 122B of FIG. 1A, a conductive wall via pad 838A corresponding to a conductor 154 of the conductive wall 152A of FIG. 1B, and a conductive wall via pad 838B corresponding to a conductor 154 of the conductive wall 152B of FIG. 1B.

Stage 10 illustrates a state after formation of a dielectric layer 842 on the metal layer 834 and formation of conductive vias through the dielectric layer 842. In the example illustrated in FIG. 8C, the conductive vias include a conductive via 844, which corresponds to the conductive via 144 of FIG. 1B, conductive wall vias 846 (including conductive wall vias 846A and 846B corresponding to conductive wall vias 130 of conductive wall stacks 122A and 122B, respectively), and one or more conductive wall vias 848 (e.g., conductive wall vias 848A and 848B corresponding to conductive wall via(s) 156 of conductive wall(s) 152A and 152B, respectively). In some embodiments, the visible portions of the conductive wall via(s) 156 in the cross-sectional view illustrated in FIG. 8C may represent a single structure. The dielectric layer 842 can be formed and patterned using operations described above with reference to Stages 5-7, and the conductive vias of Stage 10 can be formed using the operations described with reference to Stage 8.

Stage 11 illustrates a state after formation and patterning of a metal layer 850 on the dielectric layer 842. The metal layer 850 can be formed and patterned using the operations described above with reference to formation and patterning of the metal layer 816 (e.g., operations described with reference to Stages 2-4). In the example illustrated in FIG. 8C, the metal layer 850 includes several conductors 852, 854, and 856. The conductor 852 corresponds to an example of the conductor(s) 146 of any of FIG. 1B or 2-6F. The conductors 854 (including the conductors 854A and 854B) correspond to examples of the conductor 132 of any of FIG. 1A, 2, or 3. The conductors 856 (including the conductors 856A and 856B) correspond to examples of the conductor 158 of any of FIG. 1B, 2, or 4-6F.

Stage 12 illustrates a state after formation of a patterned solder resist layer 860 on the metal layer 850. In the particular example illustrated in FIGS. 8A-8C, formation of a substrate 890 including one or more EM isolation structures (such as EM isolation structures 870 and 880) is complete at Stage 12. The solder resist layer 860 is optional, and if the solder resist layer 860 is omitted, formation of the substrate 890 including the EM isolation structure(s) 870, 880 may be complete at Stage 11. Alternatively, additional metal layers and/or dielectric layers can be added over the EM isolation structure(s) 870, 880 to form the completed substrate 890. In embodiments in which the substructure 802 includes a carrier layer, formation of the substrate 890 may be complete after separation of the substructure 802 from the substrate 890.

Although the substrate 890 is illustrated in FIG. 8C as including two EM isolation structures 870 and 880, in other embodiments, the substrate 890 includes more than two or fewer than two EM isolation structures. For example, the operations described with reference to FIGS. 8A-8C can be used to form the substrate 100A of FIG. 1A or the substrate 100B of FIG. 1B, each of which includes a single EM isolation structure in some embodiments. As another example, the operations described with reference to FIGS. 8A-8C can be used to form multiple instances of the EM isolation structure 870, EM isolation structure 880, or both. Additionally, in some embodiments, one or more electronic devices can be coupled to the substrate 890 to form an integrated device, as described with reference to FIG. 1D.

Exemplary Flow Diagram of a Method for Fabricating an Integrated Device Substrate Including EM Isolation Structure(s)

Figure 9:
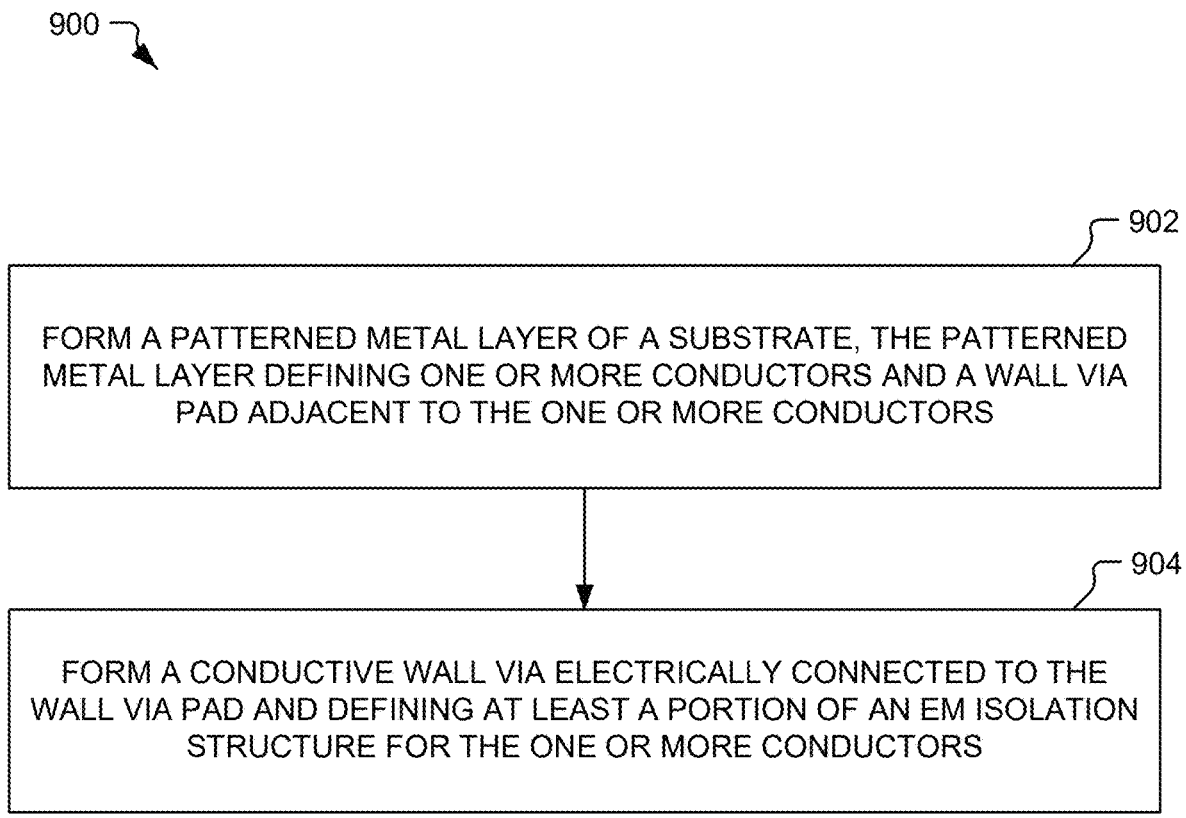
FIG. 9 illustrates an exemplary flow diagram of a method for fabricating an exemplary integrated device substrate having an embedded EM isolation structure.

In some implementations, fabricating an integrated device substrate that includes one or more EM isolation structures includes several processes. FIG. 9 illustrates an exemplary flow diagram of a method 900 for providing or fabricating an integrated device substrate that includes one or more EM isolation structures. In some implementations, the method 900 of FIG. 9 may be used to provide or fabricate an integrated device substrate including any of the EM isolation structures 120, 150, 200, 300, 400, 500, 700, 870, or 880 of FIGS. 1A-8C.

It should be noted that the flow diagram of the method 900 illustrated in FIG. 9 may combine one or more processes in order to simplify and/or clarify the method 900 for providing or fabricating an integrated device substrate that includes one or more EM isolation structures.

The method 900 includes, at block 902, forming a patterned metal layer of a substrate, the patterned metal layer defining one or more conductors and a wall via pad adjacent to the one or more conductors. For example, the patterned metal layer can include or correspond to the metal layer 106 of FIG. 1A or FIG. 1B. In this example, the one or more conductors can correspond to or include the one or more conductors 140. Further, the wall via pad can correspond to or include one of the conductive wall via pads 128 of the conductive wall stacks 122A or 122B or one of the conductor(s) 154 of the conductive walls 152A or 152B. As one example, the metal layer can be formed using operations described with reference to Stages 2-4 of FIG. 8A.

The method 900 includes, at block 904, forming a conductive wall via electrically connected to the wall via pad and defining at least a portion of an electromagnetic (EM) isolation structure for the one or more conductors. For example, the conductive wall via can correspond to or include one of the conductive wall vias 126 or 130 of the conductive wall stacks 122A or 122B or one of the conductive wall vias 156 of the conductive walls 152A or 152B. As one example, the conductive wall via can be formed using operations described with reference to Stages 5-8 of FIG. 8B.

In a particular aspect, the one or more conductors include a conductive trace, and a length of the conductive wall via extends along a length of the conductive trace. For example, as illustrated in FIG. 2, the conductor(s) 140 include one or more conductive traces oriented along an X-axis, and the conductive wall vias 130 extend along the X-axis. Further, as illustrated in FIG. 2, in some embodiments, the EM isolation structure fully encloses the conductive trace(s) along at least a portion of a length of the conductive trace.

In some embodiments, the method 900 also includes forming one or more additional conductive wall vias to form the EM isolation structure. For example, a second conductive wall via of the EM isolation structure can be formed on a side of the conductive trace opposite the conductive wall via. To illustrate, in FIG. 2, the conductive wall via 130B is formed on a side of the conductor(s) 140 opposite the conductive wall via 130A.

In some embodiments, the EM isolation structure extends above and below the one or more conductors. For example, the method 900 may include forming a first metal layer (e.g. metal layer 104 of FIG. 1A) of the substrate; forming a second metal layer (e.g. metal layer 106 of FIG. 1A) of the substrate and patterning the second metal layer to form the patterned metal layer including the conductive trace and the wall via pad; and forming a third metal layer (e.g. metal layer 108 of FIG. 1A) of the substrate. In this example, a conductive wall via (e.g., the conductive wall via 126) is formed to extend through a first dielectric layer (e.g. the dielectric layer 112) between the first metal layer (e.g., the metal layer 104) and the second metal layer (e.g., the metal layer 106) and to electrically connect to the wall via pad (e.g., the wall via pad 128). Further, in this example, the method 900 can include forming a second conductive wall via (e.g., the conductive wall via 130) extending through a second dielectric layer (e.g., the dielectric layer 116)

between the second metal layer (e.g., the metal layer 106) and the third metal layer (e.g., the metal layer 108), where the second conductive wall via is electrically connected to the wall via pad. The method 900 can also include forming third and fourth (and optionally more than four) conductive wall vias of the EM isolation structure. For example, a third conductive wall via can be formed that extends through the first dielectric layer and is electrically connected to a second wall via pad of the second metal layer, and a fourth conductive wall via can be formed that extends through the second dielectric layer and is electrically connected to the second wall via pad.

The method 900 can also include electrically connecting the EM isolation structure to a reference voltage conductor of the substrate. For example, the reference voltage conductor can include a ground conductor or a power conductor of a power distribution network.

In some implementations, fabricating an integrated device substrate that includes one or more EM isolation structures includes several processes. FIG. 10 illustrates another exemplary flow diagram of a method 1000 for providing or fabricating an integrated device substrate that includes one or more EM isolation structures. In some implementations, the method 1000 of FIG. 10 may be used to provide or fabricate an integrated device substrate including any of the EM isolation structures 150, 200, 300, 400, 500, 700, 870, or 880 of FIG. 1B-6F or 8C.

It should be noted that the flow diagram of the method 1000 illustrated in FIG. 10 may combine one or more processes in order to simplify and/or clarify the method 1000 for providing or fabricating an integrated device substrate that includes one or more EM isolation structures.

The method 1000 includes, at block 1002, forming a conductive via through a dielectric layer of a substrate, where the conductive via electrically connects a first conductor of a first metal layer of the substrate to a second conductor of a second metal layer of the substrate, and where the dielectric layer is disposed between the first metal layer and the second metal layer. For example, the conductive via can correspond to or include the conductive via 144 of FIG. 1B, which is electrically connected to the conductor 142 and to the conductor 146 through the dielectric layer 116.

The method 1000 includes, at block 1004, forming a conductive wall via through the dielectric layer, where the conductive wall via at least partially encircles the conductive via to define at least a portion of an EM isolation structure for the conductive via. For example, the conductive wall via can correspond to or include the conductive wall via 156 of FIG. 1B, which at least partially encircles the conductive via 144. For example, the conductive wall via can include a curved portion having a concave face on a side proximate the conductive via. In this example, the curved portion defines an arc, which can span various angles depending on the particular configuration. To illustrate, the arc can span at least 90 degrees, at least 180 degrees, or at least 270 degrees.

In some embodiments, the method 1000 also includes patterning the first metal layer to define the first conductor; a first via pad electrically connecting the conductive via to the first conductor; and a first wall pad at least partially encircling the first via pad and electrically connected to the conductive wall via. For example, the first metal layer can correspond to or include the metal layer 106 of FIG. 1B, which includes the conductor 142, which can include a via pad for the conductive via 144 connected to a conductive trace of the metal layer 106. In this example, the metal layer 106 also includes the conductor 154, which acts as a wall pad for the conductive wall via 156. In such embodiments, the method 1000 can also include patterning the second metal layer to define the second conductor; a second via pad electrically connecting the conductive via to the second conductor; and a second wall pad at least partially encircling the second via pad and electrically connected to the conductive wall via. For example, the second metal layer can correspond to or include the metal layer 108 of FIG. 1B, which includes the conductor 146, which can include a via pad for the conductive via 144. In this example, the metal layer 108 also includes the conductor 158, which at least partially encircles the conductor 146 and is electrically connected to the conductive wall via 156.

The method 1000 can also include electrically connecting the EM isolation structure to a reference voltage conductor of the substrate. For example, the reference voltage conductor can include a ground conductor or a power conductor of a power distribution network.

Exemplary Electronic Devices

Figure 11:
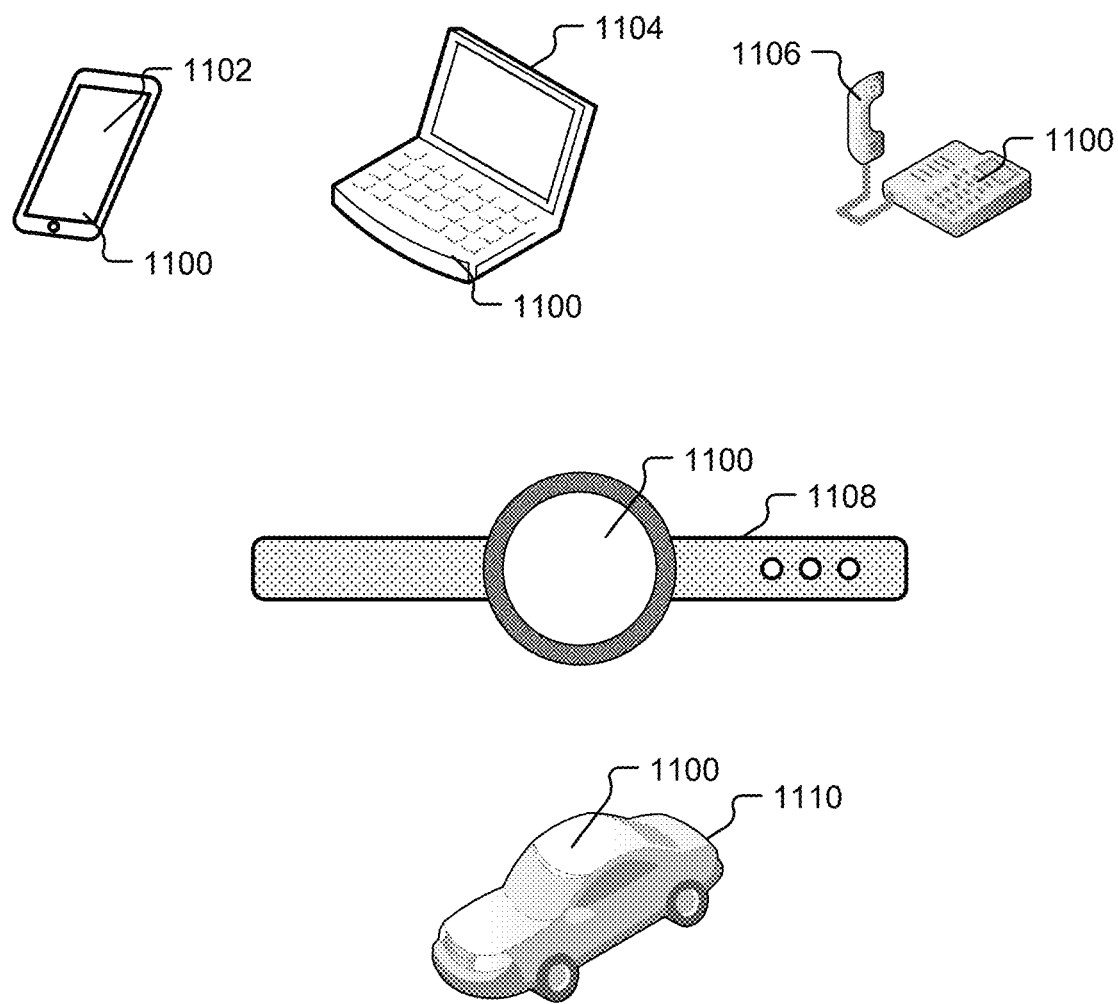
FIG. 11 illustrates various electronic devices that may include an integrated device including a substrate having an embedded EM isolation structure, as described herein.

FIG. 11 illustrates various electronic devices that may include or be integrated with a device that includes a substrate including an embedded EM isolation structure, such as any of the EM isolation structures 120, 150, 200, 300, 400, 500, 700, 870, or 880. For example, a mobile phone device 1102, a laptop computer device 1104, a fixed location terminal device 1106, a wearable device 1108, or a vehicle 1110 (e.g., an automobile or an aerial device) may include a device 1100. The device 1100 can include, for example, a device that includes a substrate including an embedded EM isolation device, such as any of the EM isolation structures 120, 150, 200, 300, 400, 500, 700, 870, or 880, as described herein. The devices 1102, 1104, 1106 and 1108 and the vehicle 1110 illustrated in FIG. 11 are merely exemplary. Other electronic devices may also feature the device 1100 including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices (e.g., watches, glasses), Internet of things (IoT) devices, servers, routers, electronic devices implemented in vehicles (e.g., autonomous vehicles), or any other device that stores or retrieves data or computer instructions, or any combination thereof.

One or more of the components, processes, features, and/or functions illustrated in FIGS. 1-11 may be rearranged and/or combined into a single component, process, feature or function or embodied in several components, processes, or functions. Additional elements, components, processes, and/or functions may also be added without departing from the disclosure. It should also be noted FIGS. 1-11 and its corresponding description in the present disclosure is not limited to dies and/or ICs. In some implementations, FIGS. 1-11 and its corresponding description may be used to manufacture, create, provide, and/or produce devices and/or integrated devices. In some implementations, a device may include a die, an integrated device, an integrated passive device (IPD), a die package, an integrated circuit (IC) device, a device package, an integrated circuit (IC) package, a wafer, a semiconductor device, a package-on-package (PoP) device, a heat dissipating device and/or an interposer.

It is noted that the figures in the disclosure may represent actual representations and/or conceptual representations of various parts, components, objects, devices, packages, integrated devices, integrated circuits, and/or transistors. In some instances, the figures may not be to scale. In some instances, for purpose of clarity, not all components and/or parts may be shown. In some instances, the position, the location, the sizes, and/or the shapes of various parts and/or components in the figures may be exemplary. In some implementations, various components and/or parts in the figures may be optional.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling (e.g., mechanical coupling) between two objects. For example, if object A physically touches object B, and object B touches object C, then objects A and C may still be considered coupled to one another-even if they do not directly physically touch each other. An object A, that is coupled to an object B, may be coupled to at least part of object B. The term "electrically coupled" may mean that two objects are directly or indirectly coupled together such that an electrical current (e.g., signal, power, ground) may travel between the two objects. Two objects that are electrically coupled may or may not have an electrical current traveling between the two objects. The use of the terms "first", "second", "third" and "fourth" (and/or anything above fourth) is arbitrary. Any of the components described may be the first component, the second component, the third component or the fourth component. For example, a component that is referred to as a second component, may be the first component, the second component, the third component or the fourth component. The terms "encapsulate", "encapsulating" and/or any derivation means that the object may partially encapsulate or completely encapsulate another object. The terms "top" and "bottom" are arbitrary. A component that is located on top may be located over a component that is located on a bottom. A top component may be considered a bottom component, and vice versa. As described in the disclosure, a first component that is located "over" a second component may mean that the first component is located above or below the second component, depending on how a bottom or top is arbitrarily defined. In another example, a first component may be located over (e.g., above) a first surface of the second component, and a third component may be located over (e.g., below) a second surface of the second component, where the second surface is opposite to the first surface. It is further noted that the term "over" as used in the present application in the context of one component located over another component, may be used to mean a component that is on another component and/or in another component (e.g., on a surface of a component or embedded in a component). Thus, for example, a first component that is over the second component may mean that (1) the first component is over the second component, but not directly touching the second component, (2) the first component is on (e.g., on a surface of) the second component, and/or (3) the first component is in (e.g., embedded in) the second component. A first component that is located "in" a second component may be partially located in the second component or completely located in the second component. A value that is about X-XX, may mean a value that is between X and XX, inclusive of X and XX. The value(s) between X and XX may be discrete or continuous.

The term "about 'value X'", or "approximately value X", as used in the disclosure means within 10 percent of the 'value X'. For example, a value of about 1 or approximately 1, would mean a value in a range of 0.9-1.1. A "plurality" of components may include all the possible components or only some of the components from all of the possible components. For example, if a device includes ten components, the use of the term "the plurality of components" may refer to all ten components or only some of the components from the ten components.

In some implementations, an interconnect is an element or component of a device or package that allows or facilitates an electrical connection between two points, elements and/or components. In some implementations, an interconnect may include a trace, a via, a pad, a pillar, a metallization layer, a redistribution layer, and/or an under bump metallization (UBM) layer/interconnect. In some implementations, an interconnect may include an electrically conductive material that may be configured to provide an electrical path for a signal (e.g., a data signal), ground and/or power. An interconnect may include more than one element or component. An interconnect may be defined by one or more interconnects. An interconnect may include one or more metal layers. An interconnect may be part of a circuit. Different implementations may use different processes and/or sequences for forming the interconnects. In some implementations, a chemical vapor deposition (CVD) process, a physical vapor deposition (PVD) process, a sputtering process, a spray coating, and/or a plating process may be used to form the interconnects.

Also, it is noted that various disclosures contained herein may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

In the following, further examples are described to facilitate the understanding of the disclosure.

According to Example 1, an integrated device includes a substrate that includes one or more conductors; and a conductive wall via defining at least a portion of an EM isolation structure for the one or more conductors.

Example 2 includes the integrated device of Example 1, wherein the substrate further comprises a reference voltage conductor, and wherein the EM isolation structure is electrically connected to the reference voltage conductor.

Example 3 includes the integrated device of Example 1 or Example 2, wherein the one or more conductors include a conductive via, and wherein the conductive wall via includes a curved portion having a concave face on a side proximate the conductive via.

Example 4 includes the integrated device of any of Examples 1 to 3, wherein the one or more conductors include a conductive via, and wherein the conductive wall via includes a curved portion that at least partially encircles the conductive via.

Example 5 includes the integrated device of Example 4, wherein the curved portion of the conductive wall via defines an arc spanning at least 90 degrees.

Example 6 includes the integrated device of Example 4, wherein the curved portion of the conductive wall via defines an arc spanning at least 180 degrees.

Example 7 includes the integrated device of Example 4, wherein the curved portion of the conductive wall via defines an arc spanning at least 270 degrees.

Example 8 includes the integrated device of any of Examples 1 to 7, wherein the conductive wall via extends through a dielectric layer, and the EM isolation structure further comprises a pad of a metal layer adjacent to the dielectric layer.

Example 9 includes the integrated device of Example 8, wherein the one or more conductors include a conductive via and a second pad of the metal layer, wherein the pad at least partially encircles the second pad.

Example 10 includes the integrated device of Example 9 and further includes a conductive trace electrically connected to the second pad.

Example 11 includes the integrated device of any of Examples 1 to 10, wherein the one or more conductors include a conductive trace, and wherein a length of the conductive wall via extends along a length of the conductive trace.

Example 12 includes the integrated device of Example 11, wherein the EM isolation structure further comprises a second conductive wall via on a side of the conductive trace opposite the conductive wall via.

Example 13 includes the integrated device of Example 11 or Example 12, wherein the EM isolation structure fully encloses the conductive trace along at least a portion of a length of the conductive trace.

Example 14 includes the integrated device of any of Examples 11 to 13, wherein the substrate comprises a first metal layer; a second metal layer including the conductive trace and a wall via pad; and a third metal layer, wherein the second metal layer is between the first metal layer and the third metal layer.

Example 15 includes the integrated device of Example 14, wherein the conductive wall via extends through a first dielectric layer between the first metal layer and the second metal layer and is electrically connected to the wall via pad.

Example 16 includes the integrated device of Example 15, wherein the EM isolation structure further comprises a second conductive wall via extending through a second dielectric layer between the second metal layer and the third metal layer, and wherein the second conductive wall via is electrically connected to the wall via pad.

Example 17 includes the integrated device of Example 16, wherein the EM isolation structure further comprises a third conductive wall via extending through the first dielectric layer and electrically connected to a second wall via pad of the second metal layer; and a fourth conductive wall via extending through the second dielectric layer and electrically connected to the second wall via pad.

According to Example 18, a method of fabricating an integrated device substrate includes forming a patterned metal layer of a substrate, the patterned metal layer defining one or more conductors and a wall via pad adjacent to the one or more conductors; and forming a conductive wall via electrically connected to the wall via pad and defining at least a portion of an EM isolation structure for the one or more conductors.

Example 19 includes the method of Example 18 and further includes electrically connecting the EM isolation structure to a reference voltage conductor of the substrate.

Example 20 includes the method of Example 18 or Example 19, wherein the one or more conductors include a conductive trace, and wherein a length of the conductive wall via extends along a length of the conductive trace.

Example 21 includes the method of Example 20 and further includes forming a second conductive wall via of the EM isolation structure on a side of the conductive trace opposite the conductive wall via.

Example 22 includes the method of Example 21, wherein the EM isolation structure fully encloses the conductive trace along at least a portion of a length of the conductive trace.

Example 23 includes the method of any of Examples 20 to 22 and further includes forming a first metal layer of the substrate; forming a second metal layer of the substrate and patterning the second metal layer to form the patterned metal layer including the conductive trace and the wall via pad; and forming a third metal layer of the substrate, wherein the second metal layer is between the first metal layer and the third metal layer.

Example 24 includes the method of Example 23, wherein the conductive wall via is formed to extend through a first dielectric layer between the first metal layer and the second metal layer and to electrically connect to the wall via pad.

Example 25 includes the method of Example 24 and further includes forming a second conductive wall via of the EM isolation structure, the second conductive wall via extending through a second dielectric layer between the second metal layer and the third metal layer, and wherein the second conductive wall via is electrically connected to the wall via pad.

Example 26 includes the method of Example 25 and further includes forming a third conductive wall via of the EM isolation structure, the third conductive wall via extending through the first dielectric layer and electrically connected to a second wall via pad of the second metal layer; and forming a fourth conductive wall via of the EM isolation structure, the fourth conductive wall via extending through the second dielectric layer and electrically connected to the second wall via pad.

According to Example 27, a method of fabricating an integrated device substrate includes forming a conductive via through a dielectric layer of a substrate, the conductive via electrically connecting a first conductor of a first metal layer of the substrate to a second conductor of a second metal layer of the substrate, wherein the dielectric layer is disposed between the first metal layer and the second metal layer; and forming a conductive wall via through the dielectric layer, the conductive wall via at least partially encircling the conductive via to define at least a portion of an EM isolation structure for the conductive via.

Example 28 includes the method of Example 27 and further includes electrically connecting the EM isolation structure to a reference voltage conductor of the substrate.

Example 29 includes the method of Example 27 or Example 28, wherein the conductive wall via includes a curved portion having a concave face on a side proximate the conductive via.

Example 30 includes the method of any of Examples 27 to 29, wherein the conductive wall via includes a curved portion that at least partially encircles the conductive via.

Example 31 includes the method of Example 30, wherein the curved portion of the conductive wall via defines an arc spanning at least 90 degrees.

Example 32 includes the method of Example 30, wherein the curved portion of the conductive wall via defines an arc spanning at least 180 degrees.

Example 33 includes the method of Example 30, wherein the curved portion of the conductive wall via defines an arc spanning at least 270 degrees.

Example 34 includes the method of any of Examples 27 to 33 and further includes patterning the first metal layer to define: the first conductor; a first via pad electrically connecting the conductive via to the first conductor; and a first wall pad at least partially encircling the first via pad and electrically connected to the conductive wall via.

Example 35 includes the method of Example 34 and further includes patterning the second metal layer to define: the second conductor; a second via pad electrically connecting the conductive via to the second conductor; and a second wall pad at least partially encircling the second via pad and electrically connected to the conductive wall via.

The various features of the disclosure described herein can be implemented in different systems without departing from the disclosure. It should be noted that the foregoing aspects of the disclosure are merely examples and are not to be construed as limiting the disclosure. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

The invention claimed is:

1. An integrated device comprising:
a substrate comprising:
one or more conductors, wherein the one or more conductors include a conductive via; and
a conductive wall via defining at least a portion of an electromagnetic (EM) isolation structure for the one or more conductors, wherein the conductive wall via includes a curved portion defining an arc spanning at least 90 degrees, and wherein the curved portion at least partially encircles the conductive via.

2. The integrated device of claim 1, wherein the substrate further comprises a reference voltage conductor, and wherein the EM isolation structure is electrically connected to the reference voltage conductor.

3. The integrated device of claim 1, wherein the conductive wall via extends through a dielectric layer, and the EM isolation structure further comprises a pad of a metal layer adjacent to the dielectric layer.

4. The integrated device of claim 3, wherein the one or more conductors include a second pad of the metal layer, wherein the pad at least partially encircles the second pad.

5. The integrated device of claim 4, further comprising a conductive trace electrically connected to the second pad.

6. An integrated device comprising:
a substrate comprising:
one or more conductors, wherein the one or more conductors include a conductive trace;
a first metal layer;
a second metal layer that includes the conductive trace and a wall via pad;
a third metal layer, wherein the second metal layer is between the first metal layer and the third metal layer; and
a conductive wall via that defines at least a portion of an electromagnetic (EM) isolation structure for the one or more conductors, wherein a length of the conductive wall via extends along a length of the conductive trace, and wherein the conductive wall via extends through a first dielectric layer between the first metal layer and the second metal layer and is electrically connected to the wall via pad.

7. The integrated device of claim 6, wherein the EM isolation structure further comprises a second conductive wall via on a side of the conductive trace opposite the conductive wall via.

8. The integrated device of claim 6, wherein the EM isolation structure fully encloses the conductive trace along at least a portion of the length of the conductive trace.

9. The integrated device of claim 6, wherein the EM isolation structure further comprises a second conductive wall via extending through a second dielectric layer between the second metal layer and the third metal layer, and wherein the second conductive wall via is electrically connected to the wall via pad.

10. The integrated device of claim 9, wherein the EM isolation structure further comprises:
a third conductive wall via extending through the first dielectric layer and electrically connected to a second wall via pad of the second metal layer; and
a fourth conductive wall via extending through the second dielectric layer and electrically connected to the second wall via pad.

* * * * *